United States Patent
Huang et al.

(10) Patent No.: US 10,811,532 B2
(45) Date of Patent: Oct. 20, 2020

(54) HIGH VOLTAGE DEVICE AND MANUFACTURING METHOD THEREOF

(71) Applicant: RICHTEK TECHNOLOGY CORPORATION, Zhubei, Hsinchu (TW)

(72) Inventors: Tsung-Yi Huang, Hsinchu (TW); Chien-Yu Chen, Hsinchu (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 65 days.

(21) Appl. No.: 16/352,795

(22) Filed: Mar. 13, 2019

(65) Prior Publication Data

US 2019/0378924 A1    Dec. 12, 2019

(30) Foreign Application Priority Data

Jun. 12, 2018 (TW) .............................. 107120252 A

(51) Int. Cl.
| | |
|---|---|
| *H01L 29/78* | (2006.01) |
| *H01L 29/10* | (2006.01) |
| *H01L 21/762* | (2006.01) |
| *H01L 29/06* | (2006.01) |
| *H01L 29/66* | (2006.01) |

(52) U.S. Cl.
CPC .... *H01L 29/7816* (2013.01); *H01L 21/76202* (2013.01); *H01L 29/0642* (2013.01); *H01L 29/1095* (2013.01); *H01L 29/66681* (2013.01)

(58) Field of Classification Search
CPC ............. H01L 29/7816; H01L 29/1095; H01L 21/76202; H01L 29/0642; H01L 29/66681; H01L 29/66689; H01L 29/1083; H01L 29/0653; H01L 29/0692; H01L 29/42368
See application file for complete search history.

(56) References Cited

U.S. PATENT DOCUMENTS

| | | | |
|---|---|---|---|
| 2011/0127602 A1* | 6/2011 | Mallikarjunaswamy | ..................... H01L 29/0649 257/331 |
| 2020/0075759 A1* | 3/2020 | Pala | ...................... H01L 29/404 |

FOREIGN PATENT DOCUMENTS

TW            201011913 A      9/2008

* cited by examiner

*Primary Examiner* — David Vu
(74) *Attorney, Agent, or Firm* — Tung & Associates

(57) ABSTRACT

A high voltage device includes: a semiconductor layer, an isolation structure, a drift oxide region, a well, a body region, a body contact, a buffer region, a gate, and a source and a drain. The body contact includes a main body contact and at least one sub-body contact. The main body contact is adjacent to the source, wherein the main body contact and the source are rectangles that extend along a width direction, and the source is located between the main body contact and the gate. The sub-body contact extends from the main body contact toward the gate and contacts an inverse current channel. The buffer region encompasses all the periphery of the body region below a top surface of the semiconductor layer, wherein an impurity concentration of the buffer region is lower than an impurity concentration of the body region.

20 Claims, 22 Drawing Sheets

Fig. 3B

HIGH VOLTAGE DEVICE AND MANUFACTURING METHOD THEREOF

CROSS REFERENCES

The present invention claims priority to TW 107120252 filed on Jun. 12, 2018.

BACKGROUND OF THE INVENTION

Field of Invention

The present invention relates to a high voltage device and a manufacturing method thereof; particularly, it relates to a high voltage device capable of suppressing turning-ON a parasitic transistor therein and a manufacturing method of the high voltage device.

Description of Related Art

FIGS. 1A and 1B are a cross-section view and a top view, respectively, of a conventional high voltage device 100. The term "high voltage" device refers to a transistor device wherein a drain thereof is required to withstand a voltage that is higher than 5V during normal operation. In general, there is a drift region 12a (as indicated by the dashed line frame in FIG. 1B) between a drain 19 and a gate 17 of the high voltage device 100 to separate the drain 19 and the gate 17, and the length of the drift region 12a in the channel direction (as indicated by the dashed arrow in FIGS. 1A and 1B) is designed according to the operation voltage that the high voltage device 100 is designed to withstand during normal operation.

As shown in FIGS. 1A and 1B, the high voltage device 100 includes a well region 12, an isolation structure 13, a drift oxide region 14, a body region 16, a body electrode 16', a gate 17, a source 18, and a drain 19. The well region 12 which has N-type conductivity is formed on a substrate 11, and the isolation structure 13 which is a local oxidation of silicon (LOCOS) structure defines an operation region 13a of the high voltage device 100. The range of the operation region 13a is indicated by the thick dashed line frame in FIG. 1A. The gate 17 covers a portion of the drift oxide region 14. When the high voltage device 100 operates, electron holes as hot carriers which are generated by the high electric field are injected into the body electrode 16' via the body region 16, and the hot carrier current will increase a forward voltage between the body region 16 and the source 18 so that a parasitic transistor formed by the body region 16, the source 18 and the well region 12 is turned on; this unwanted effect will limit the safe operation area (SOA). (The definition and details of SOA are known to a person having ordinary skill in the art, so they are not redundantly explained here.) Because the PN junction between the body region 16 and the well region 12 has a high capacitance, a transient response during an operation of the high voltage device 100 also generates a shift current between the source 18 and the body region 16, which also turns on the parasitic transistor.

In view of the above, the present invention provides a high voltage device and a manufacturing method thereof, to suppress a possibility of turning ON the parasitic transistor and to improve the SOA when the high voltage device operates.

SUMMARY OF THE INVENTION

From one perspective, the present invention provides a high voltage device comprising: a semiconductor layer formed on a substrate, wherein the semiconductor layer has a top surface and a bottom surface that is opposite to the top surface in a vertical direction; an isolation structure formed on and in contact with the top surface, wherein the isolation structure defines an operation region; a drift oxide region formed on and in contact with the top surface, wherein the drift oxide region is located on a drift region in the operation region and in contact with the drift region; a well region having a first conductivity type, wherein the well region is formed in the operation region, and the well region is formed beneath the top surface and in contact with the top surface in the vertical direction; a body region having a second conductivity type, wherein the body region is formed in the well region in the operation region and is located beneath the top surface and in contact with the top surface in the vertical direction, and the body region has a first impurity concentration; a body electrode having the second conductivity type, the body electrode serving as an electrical contact of the body region, wherein the body electrode is formed in the body region, beneath the top surface and in contact with the top surface, and the body electrode includes a main body electrode and at least one sub-body electrode; a buffer region having the second conductivity type, wherein the buffer region is formed in the well region in the operation region, beneath the top surface and in contact with the top surface in the vertical direction, and the buffer region encompasses all periphery of the body region below the top surface, wherein the buffer region has a second impurity concentration which is lower than the first impurity concentration; a gate formed on the top surface in the operation region, wherein the gate is substantially a rectangle that extends along a width direction which is a direction perpendicular to the vertical direction, and a portion of the body region and the buffer region are located right below the gate and in contact with the gate to assist forming an inverse current channel during ON operation of the high voltage device; and a source and a drain having the first conductivity type, wherein the source and the drain are formed in the operation region, beneath the top surface and in contact with the top surface in the vertical direction, and the source and the drain are located outside and beneath the gate, and respectively at two lateral sides of the gate, wherein the source is located in the body region and the drain is located in the well region at a location which is away from the body region; wherein the drift region is located in the well region, between the drain and the buffer region in a channel direction which is a direction perpendicular to the vertical direction and the width direction, and is in contact with the top surface, to serve as a drift current channel during ON operation of the high voltage device; wherein the main body electrode is adjacent to the source, and the main body electrode and the source are substantially rectangles that extend along the width direction, wherein the source is located between the main body electrode and the gate, and the sub-body electrode extends from the main body electrode toward the gate in the channel direction and contacts the inverse current channel.

From another perspective, the present invention provides a manufacturing method of a high voltage device, comprising: forming a semiconductor layer formed on a substrate, wherein the semiconductor layer has a top surface and a bottom surface that is opposite to the top surface in a vertical direction; forming an isolation structure on and in contact with the top surface, wherein the isolation structure defines an operation region; forming a drift oxide region on and in contact with the top surface, wherein the drift oxide region is located on a drift region in the operation region and in contact with the drift region; forming a well region in the operation region, wherein the well region is formed beneath the top surface and in contact with the top surface in the vertical direction, and the well region has a first conductivity type; forming a body region having a second conductivity type in the well region in the operation region, wherein the body region is located beneath the top surface and in contact with the top surface in the vertical direction, and the body region has a first impurity concentration; forming a body electrode having the second conductivity type in the body region to serve as an electrical contact of the body region, wherein the body electrode is located beneath the top surface and in contact with the top surface in the vertical direction, and the body electrode includes a main body electrode and at least one sub-body electrode; forming a buffer region having the second conductivity type in the well region in the operation region, beneath the top surface and in contact with the top surface in the vertical direction, wherein the buffer region encompasses all periphery of the body region below the top surface, and wherein the buffer region has a second impurity concentration which is lower than the first impurity concentration; forming a gate on the top surface in the operation region, wherein the gate is substantially a rectangle that extends along a width direction which is a direction perpendicular to the vertical direction, and a portion of the body region and the buffer region are located right below the gate and in contact with the gate to assist forming an inverse current channel during ON operation of the high voltage device; forming a source and a drain having the first conductivity type, wherein the source and the drain are formed in the operation region, beneath the top surface and in contact with the top surface in the vertical direction, and the source and the drain are located outside and beneath the gate, and respectively at two lateral sides of the gate, wherein the source is located in the body region and the drain is located in the well region at a location which is away from the body region; wherein the drift region is located in the well region, between the drain and the buffer region in a channel direction which is a direction perpendicular to the vertical direction and the width direction, and is in contact with the top surface, to serve as a drift current channel during ON operation of the high voltage device; wherein the main body electrode is adjacent to the source, and the main body electrode and the source are substantially rectangles that extend along the width direction, wherein the source is located between the main body electrode and the gate, and the sub-body electrode extends from the main body electrode toward the gate in the channel direction and contacts the inverse current channel.

From another perspective, the present invention provides a high voltage device comprising: a semiconductor layer formed on a substrate, wherein the semiconductor layer has a top surface and a bottom surface that is opposite to the top surface in a vertical direction; an isolation structure formed on and in contact with the top surface, wherein the isolation structure defines an operation region; a drift oxide region formed on and in contact with the top surface, wherein the drift oxide region is located on a drift region in the operation region and in contact with the drift region; a drift well region having a first conductivity type, wherein the drift well region is formed in the operation region of the semiconductor layer and the drift well region is formed beneath the top surface and in contact with the top surface in the vertical direction; a channel well region having a second conductivity type, wherein the channel well region is formed in the operation region and is located beneath the top surface and in contact with the top surface, and the channel well region has a first impurity concentration; a channel well region contact having the second conductivity type, the channel well region contact serving as an electrical contact of the channel well region, wherein the channel well region contact is formed in the channel well region, beneath the top surface and in contact with the top surface in the vertical direction, and the channel well region contact includes a main channel well region contact and at least one sub-channel well region contact; a buffer region having the second conductivity type in the operation region, wherein the buffer region is formed beneath the top surface and in contact with the top surface in the vertical direction, and the buffer region encompasses all periphery of the channel well region below the top surface of the semiconductor layer, and the buffer region is in contact with the drift well region in a channel direction which is a direction perpendicular to the vertical direction, wherein the buffer region has a second impurity concentration which is lower than the first impurity concentration; a buried layer having the first conductivity type, wherein the buried layer is formed beneath the channel well region and in contact with the channel well region in the vertical direction, and the buried layer completely covers a portion of the channel well region in the operation region; a gate formed on the top surface in the operation region, wherein the gate is substantially a rectangle that extends along a width direction which is a direction perpendicular to the vertical direction and the channel direction, and a portion of the body region and the buffer region are located right below the gate and in contact with the gate to assist forming an inverse current channel during ON operation of the high voltage device; and a source and a drain having the first conductivity type, wherein the source and the drain are formed in the operation region, beneath the top surface and in contact with the top surface in the vertical direction, and the source and the drain are located outside and beneath the gate, and respectively at two lateral sides of the gate, wherein the source is located in the channel well region and the drain is located in the drift well region at a location which is away from the channel well region; wherein the drift region is located in the drift well region, between the drain and the buffer region in the channel direction, and is in contact with the top surface, to serve as a drift current channel during ON operation of the high voltage device; wherein the main channel well region contact is adjacent to the source, and the main channel well region contact and the source substantially are rectangles that extend along the width direction, wherein the source is located between the main channel well region contact and the gate, and the sub-channel well region contact extends from the main channel well region contact toward the gate in the channel direction and contacts the inverse current channel.

From another perspective, the present invention provides a manufacturing method of a high voltage device, comprising: forming a semiconductor layer on a substrate, wherein the semiconductor layer has a top surface and a bottom surface that is opposite to the top surface in a vertical direction; forming an isolation structure on and in contact with the top surface, wherein the isolation structure defines an operation region; forming a drift oxide region on and in contact with the top surface, wherein the drift oxide region is located on a drift region in the operation region and in contact with the drift region; forming a drift well region having a first conductivity type in the operation region of the semiconductor layer, wherein the drift well region is formed beneath the top surface and in contact with the top surface in the vertical direction; forming a channel well region having a second conductivity type in the operation region, beneath the top surface and in contact with the top surface in the vertical direction, wherein the channel well region has a first impurity concentration; forming a channel well region contact having the second conductivity type to serve as an electrical contact of the channel well region, wherein the channel well region contact is formed in the channel well region, beneath the top surface and in contact with the top surface in the vertical direction, and the channel well region contact includes a main channel well region contact and at least one sub-channel well region contact; forming a buffer region having the second conductivity type in the operation region, wherein the buffer region is formed beneath the top surface and in contact with the top surface in the vertical direction, and the buffer region encompasses all periphery of the channel well region below the top surface of the semiconductor layer, and the buffer region is in contact with the drift well region in a channel direction which is a direction perpendicular to the vertical direction, wherein the buffer region has a second impurity concentration which is lower than the first impurity concentration; forming a buried layer having the first conductivity type beneath the channel well region and in contact with the channel well region in the vertical direction, wherein the buried layer completely covers a portion of the channel well region which is in the operation region; forming a gate on the top surface in the operation region, wherein the gate is substantially a rectangle that extends along a width direction which is a direction perpendicular to the vertical direction and the channel direction, and a portion of the body region and the buffer region are located right below the gate and in contact with the gate to assist forming an inverse current channel during ON operation of the high voltage device; and forming a source and a drain having the first conductivity type, wherein the source and the drain are formed in the operation region, beneath the top surface and in contact with the top surface in the vertical direction, and the source and the drain are located outside and beneath the gate, and respectively at two lateral sides of the gate, wherein the source is located in the channel well region and the drain is located in the drift well region at a location which is away from the channel well region; wherein the drift region is located in the drift well region, between the drain and the buffer region in the channel direction, and is in contact with the top surface, to serve as a drift current channel during ON operation of the high voltage device; wherein the main channel well region contact is adjacent to the source, and the main channel well region contact and the source substantially are rectangles that extend along the width direction, wherein the source is located between the main channel well region contact and the gate, and the sub-channel well region contact extends from the main channel well region contact toward the gate in the channel direction and contacts the inverse current channel.

In one preferable embodiment, the drift oxide region includes a local oxidation of silicon (LOCOS) structure, a shallow trench isolation (STI) or a chemical vapor deposition (CVD) oxide structure.

In one preferable embodiment, the body electrode includes a plurality of sub-body electrodes which are not in contact with each other.

In one preferable embodiment, the source, the body region, the buffer region, and the well region form a parasitic transistor, and the sub-body electrode provides a hot carrier absorption channel to suppress a possibility of turning ON the parasitic transistor.

In one preferable embodiment, the buffer region is for reducing the capacitance between the body region and the well region during a transient state operation of the high voltage device.

The objectives, technical details, features, and effects of the present invention will be better understood with regard to the detailed description of the embodiments below.

DESCRIPTION OF THE PREFERABLE EMBODIMENTS

The drawings as referred to throughout the description of the present invention are for illustration only, to show the interrelations among the process steps and the layers; the shapes, thicknesses, and widths are not drawn in actual scale.

Figure 1A:
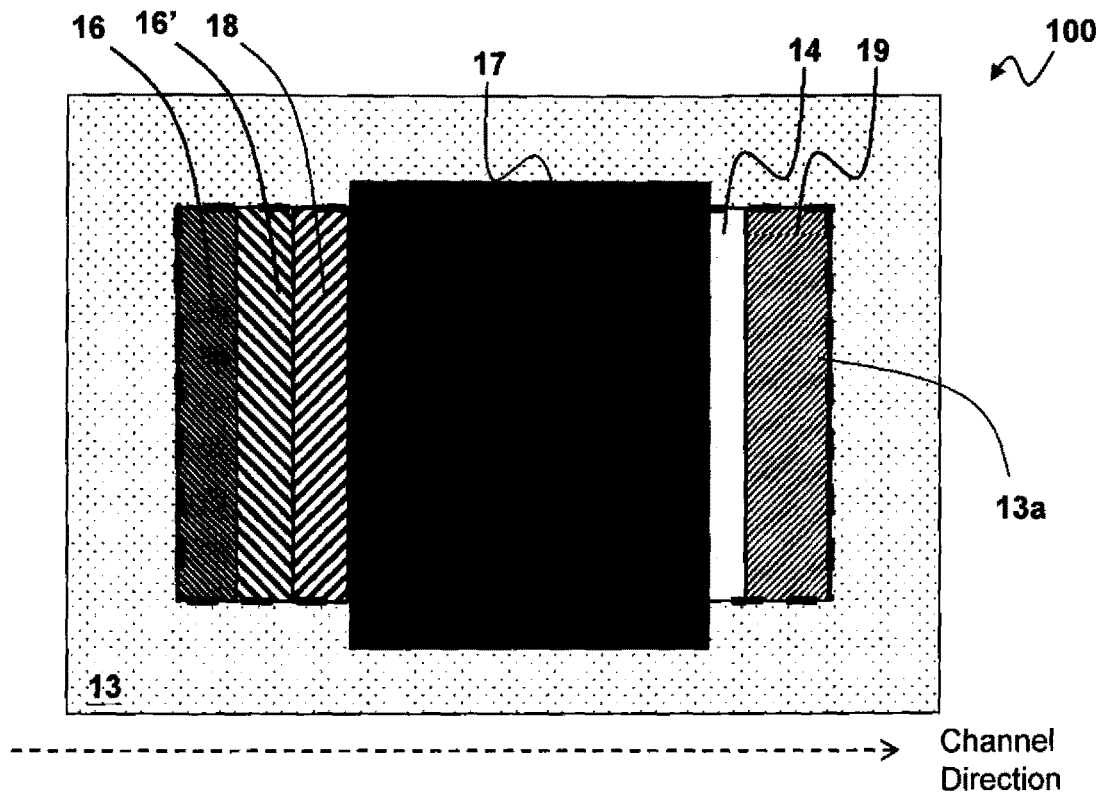
FIGS. 1A and 1B respectively show a top view and a cross-section view of a conventional high voltage device 100.
Figure 1B:
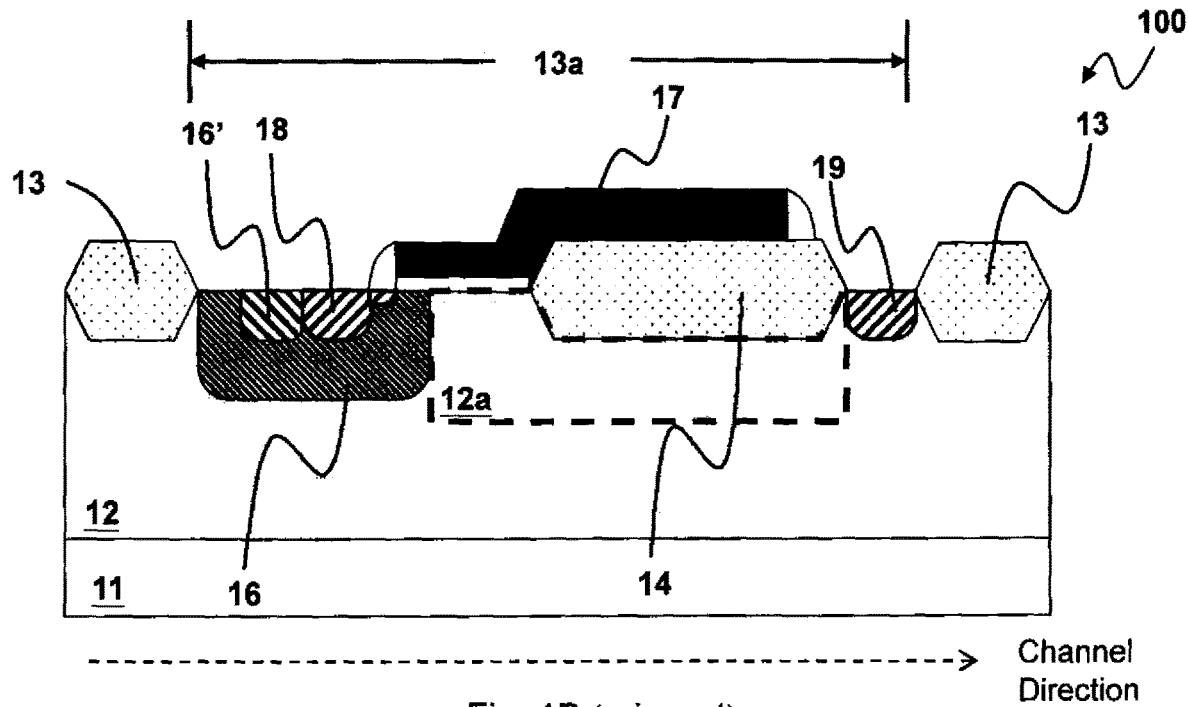
Figure 2A:
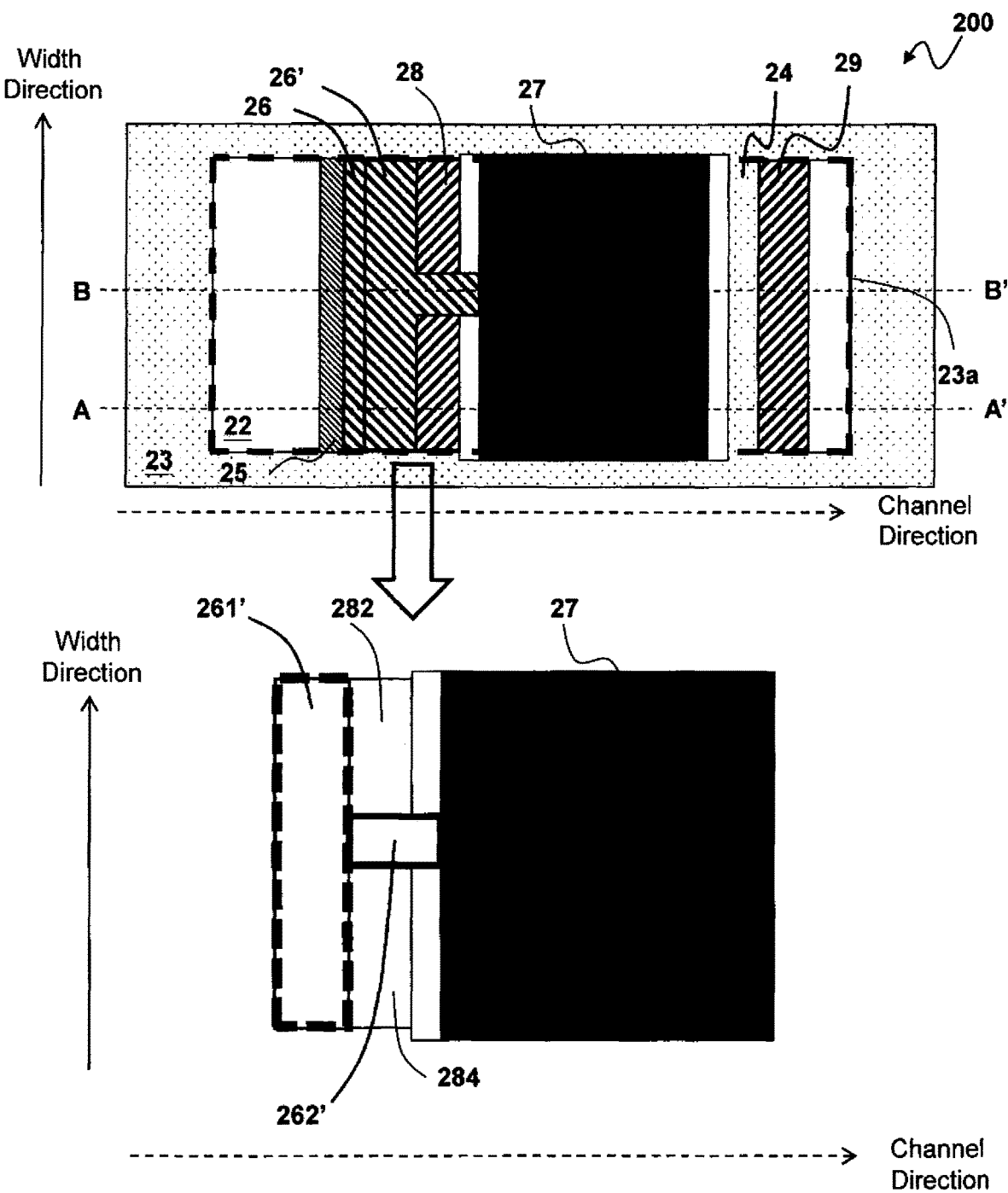
FIGS. 2A to 2C show a first embodiment of the present invention.
Figure 2B:
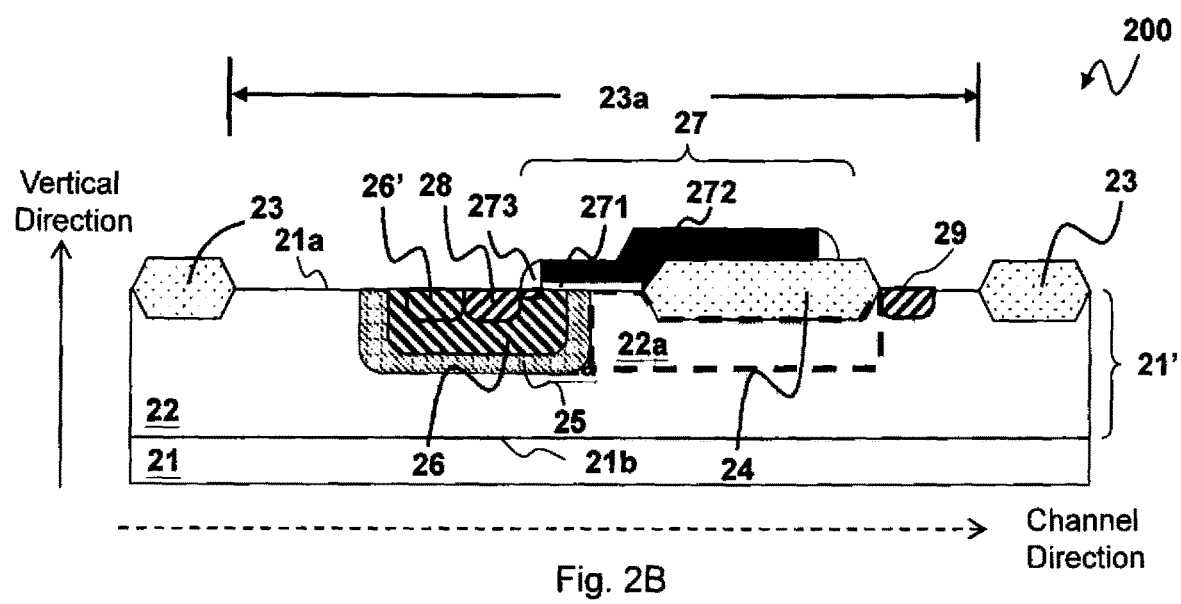
Figure 2C:
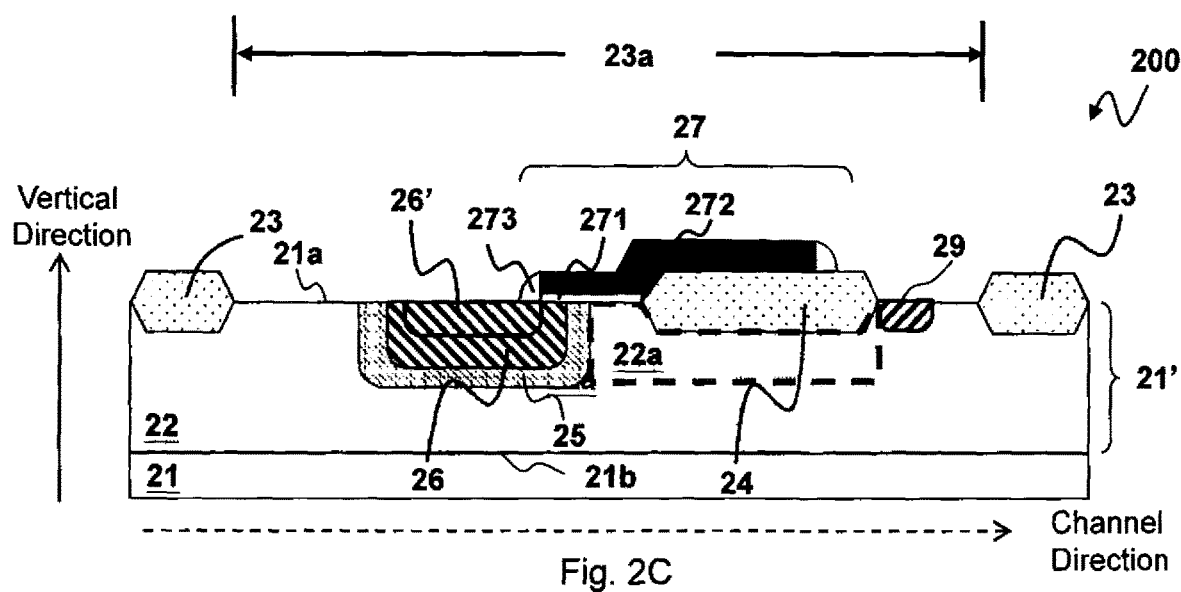

FIGS. 2A to 2C show a first embodiment of the present invention. FIGS. 2A, 2B and 2C respectively show a top view, a cross-section view according to the cross-section line AA' and a cross-section view according to the cross-section line BB' of a high voltage device 200. As shown in FIGS. 2A to 2C, the high voltage device 200 includes a semiconductor layer 21', a well region 22, an isolation structure 23, a drift oxide region 24, a buffer region 25, a body region 26, a body electrode 26', a gate 27, a source 28, and a drain 29. The semiconductor layer 21' which is formed on the substrate 21 has a top surface 21a and a bottom surface 21b that is opposite to the top surface 21a in a vertical direction (as indicated by the direction of the solid arrow in FIGS. 2B and 2C). The substrate 21 is, for example but not limited to a P-type or N-type semiconductor silicon substrate. The semiconductor layer 21' is formed on the substrate 21 for example by epitaxy, or a part of the substrate 21 forms the semiconductor layer 21'. The method of forming the semiconductor layer 21' is known to a person having ordinary skill in the art, so the details thereof are not redundantly explained here.

Still referring to FIGS. 2A to 2C, the isolation structure 23 is formed on and in contact with the top surface 21a, for defining an operation region 23a (as indicated by the dashed line frame in FIG. 2A). The isolation structure 23 is not limited to the local oxidation of silicon (LOCOS) structure as shown in FIGS. 2B and 2C, and it may be a shallow trench isolation (STI) structure instead. The drift oxide region 24 is formed on and in contact with the top surface 21a, and is located on the drift region 22a in the operation region 23a (as indicated by the dashed line frame in FIGS. 2B and 2C) and in contact with the drift region 22a.

The well region 22 which has a first conductivity type is formed in the operation region 23a of the semiconductor layer 21', and the well region 22 is located beneath the top surface 21a and in contact with the top surface 21a in the vertical direction. The body region 26 which has a second conductivity type is formed in the well region 22 in the operation region 23a; the body region 26 is located beneath the top surface 21a and in contact with the top surface 21a in the vertical direction, and the body region 26 has a first impurity concentration of the second conductivity type impurities. The body electrode 26' which has the second conductivity type serves as an electrical contact of the body region 26. The body electrode 26' is formed in the body region 26, beneath the top surface 21a and in contact with the top surface 21a in the vertical direction. As shown in the top view at the lower part of FIG. 2A, the body electrode 26' includes a main body electrode 261' and at least one sub-body electrode 262'. As shown by FIG. 2A, the main body electrode 261' is adjacent to the source 28, and the main body electrode 261' and the source 28 are substantially rectangles extending along a width direction (as indicated by the direction of the solid arrow in FIG. 2A), wherein the source 28 is located between the main body electrode 261' and the gate 27. The sub-body electrode 262' extends from a part of the main body electrode 261' toward the gate 27 in a channel direction (as indicated by the direction of the dashed arrow in FIGS. 2A to 2C), and is in contact with the inverse current channel. The buffer region 25 which has the second conductivity type is formed in the well region 22 in the operation region 23a, and the buffer region 25 is located beneath the top surface 21a and in contact with the top surface 21a in the vertical direction. The buffer region 25 encompasses all the periphery of the body regions 26 below the top surface 21a of the semiconductor layer 21'; the buffer region 25 has a second impurity concentration of the second conductivity type impurities, which is lower than the first impurity concentration. The gate 27 is formed on the top surface 21a in the operation region 23a. Viewing from the top view, the gate 27 is substantially a rectangle that extends along the width direction. In the vertical direction, a portion of the body region 26 and a portion of the buffer 25 are located beneath the gate 27 and in contact with the gate 27, to provide the inverse current channel during ON operation of the high voltage device 200.

Still referring to FIGS. 2A to 2C, the source 28 and the drain 29 have the first conductivity type. The source 28 and the drain 29 are formed in the operation region 23a, beneath the top surface 21a and in contact with the top surface 21a in the vertical direction; the source 28 and the drain 29 are located outside and beneath the gate 27, and respectively at two lateral sides of the gate 27, wherein the source 28 is located in the body region 26 and the drain 29 is located in the well region 22 at a location which is away from the body region 26 in the channel direction. The drift region 22a is located between the drain 29 and the buffer region 25 in the channel direction, in the well region 22 and is near the top surface 21a, to serve as the drift current channel during ON operation of the high voltage device 200. The source 28 and the drain 29 are located beneath the top surface 21a and in contact with the top surface 21 in the vertical direction.

Note that the term "inverse current channel" means thus. Taking this embodiment as an example, when the high voltage device 200 operates in ON operation due to the voltage applied to the gate 27, an inversion layer is formed beneath the gate 27, between the source 28 and the drift current channel, so that a conduction current flows through the region of the inversion layer, which is the inverse current channel known to a person having ordinary skill in the art.

Note that the term "drift current channel" means thus. Taking this embodiment as an example, the drift current channel refers to a region where the conduction current passes through in a drifting manner when the high-voltage device 200 operates in ON operation, which is known to a person having ordinary skill in the art.

Note that the top surface 21a as referred to does not mean a completely flat plane but refers to the surface of the semiconductor layer 21'. In the present embodiment, for example, a part of the top surface 21a where the drift oxide region 24 is in contact with has a recessed portion.

Note that the gate 27 includes a dielectric layer 271 in contact with the top surface 21a, a conductive layer 272 on the dielectric layer 271, and a spacer layer 273 having electrical insulation properties, which is known to a person having ordinary skill in the art, so the details thereof are not redundantly explained here.

Note that the above-mentioned "first conductivity type" and "second conductivity type" mean that impurities of corresponding conductivity types are doped in regions of the high voltage MOS device (for example but not limited to the aforementioned well region, body region, source and drain, etc.), so that the regions have the corresponding conductivity types. For example the first conductivity type is N-type and the second conductivity type is P-type, or the first conductivity type is P-type and the second conductivity type is N-type.

In addition, the term "high voltage" device means that, when the device operates in normal operation, the voltage applied to the drain is higher than a specific voltage, such as 5V; for devices of different high voltages, a lateral distance (drift distance) between the body region 26 and the drain 29 can be set according to the operation voltage that the device is designed to withstand during normal operation, which is known to a person having ordinary skill in the art.

The present invention is superior to the prior art in that: according to the present invention, taking the embodiment shown in FIGS. 2A to 2C as an example, when the high voltage device 200 operates, hot carriers (for example but not limited to, holes in the N-type high voltage device) which are generated by a high electric field are absorbed by a hot carrier absorption channel provided by the sub-body electrode 262', to suppress a possibility of turning ON the parasitic transistor formed by the body region 26, the buffer region 25, the source 28 and the well region 22. The aforementioned hot carrier current is reduced or not generated due to the hot carrier absorption channel provided by the sub-body electrode 262', thereby increasing the range of the safe operation area (SOA) and increasing the application range of the high voltage device 200. In addition, the buffer region 25 reduces the capacitance between the body region 26 and the well region 22 during a transient state operation of the high voltage device 200, thereby improving the transient response speed and the transient operation performance of the high voltage device 200.

In one preferable embodiment, the source 28 is separated into sub-sources 282 and 284 which are not in contact with each other because the sub-body electrode 262' extends in between, as shown in FIG. 2A.

Figures 3A, 3B, 3C:
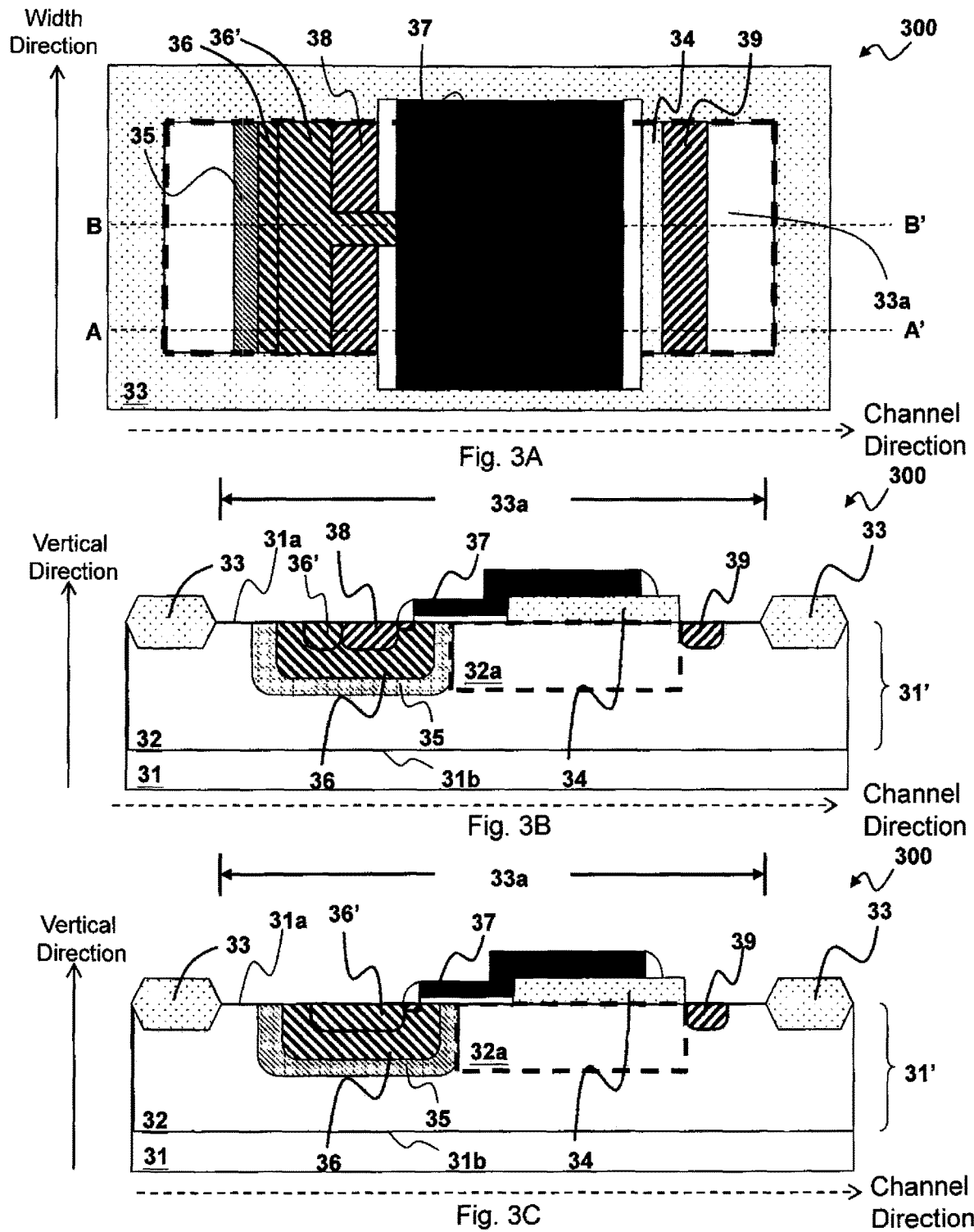
FIGS. 3A to 3C show a second embodiment of the present invention.

Please refer to FIGS. 3A to 3C, which show a second embodiment of the present invention. FIGS. 3A, 3B and 3C respectively show a top view, a cross-section view according to the cross-section line AA' and a cross-section view according to the cross-section line BB' of a high voltage device 300. As shown in FIGS. 3A to 3C, the high voltage device 300 includes a semiconductor layer 31', a well region 32, an isolation structure 33, a drift oxide region 34, a buffer region 35, a body region 36, a body electrode 36', a gate 37, a source 38, and a drain 39. The semiconductor layer 31' which is formed on the substrate 31 has a top surface 31a and a bottom surface 31b that is opposite to the top surface 31a in the vertical direction (as indicated by the direction of the solid arrow in FIGS. 3B and 3C). The substrate 31 is, for example but not limited to, a P-type or N-type semiconductor silicon substrate. The semiconductor layer 31', for example, is formed on the substrate 31 by epitaxy, or a part of the substrate 31 forms the semiconductor layer 31'. The method of forming the semiconductor layer 31' is known to a person having ordinary skill in the art, so the details thereof are not redundantly explained here.

Still referring to FIGS. 3A to 3C, the isolation structure 33 is formed on and in contact with the top surface 31a, for defining an operation region 33a (as indicated by the dashed line frame in FIG. 3A). The isolation structure 33 is not limited to the local oxidation of silicon (LOCOS) structure as shown in FIGS. 3B and 3C, and it may be a shallow trench isolation (STI) structure instead. The drift oxide region 34 is formed on and in contact with the top surface 31a, and is located on the drift region 32a in the operation region 33a (as indicated by the dashed line frame in FIGS. 3B and 3C) and in contact with the drift region 32a.

The well region 32 which has a first conductivity type is formed in the operation region 33a of the semiconductor layer 31', and the well region 32 is located beneath the top surface 31a and in contact with the top surface 31a in the vertical direction. The body region 36 which has a second conductivity type is formed in the well region 32 in the operation region 33a; the body region 36 is located beneath the top surface 31a and in contact with the top surface 31a in the vertical direction, and the body region 36 has a first impurity concentration of the second conductivity type impurities. The body electrode 36' which has the second conductivity type serves as an electrical contact of the body region 36. The body electrode 36' is formed in the body region 36, beneath the top surface 31a and in contact with the top surface 31a in the vertical direction. Similar to the top view at the lower part of FIG. 2A, the body electrode 36' includes a main body electrode and at least one sub-body electrode. As shown by FIG. 3A, the main body electrode is adjacent to the source 38, and the main body electrode and the source 38 are substantially rectangles extending along a width direction (as indicated by the direction of the solid arrow in FIG. 3A), wherein the source 38 is located between the main body electrode and the gate 37. The sub-body electrode extends from a part of the main body electrode toward the gate 37 in a channel direction (as indicated by the direction of the dashed arrow in FIGS. 3A to 3C), and is in contact with the inverse current channel. The buffer region 35 which has the second conductivity type is formed in the well region 32 in the operation region 33a, and the buffer region 35 is located beneath the top surface 31a and in contact with the top surface 31a in the vertical direction. The buffer region 35 encompasses all the periphery of the body regions 36 below the top surface 31a of the semiconductor layer 31'; the buffer region 35 has a second impurity concentration of the second conductivity type impurities, which is lower than the first impurity concentration. The gate 37 is formed on the top surface 31a in the operation region 33a.

Viewing from the top view, the gate 37 is substantially a rectangle that extends along the width direction. In the vertical direction, a portion of the body region 36 and a portion of the buffer 35 are located beneath the gate 37 and in contact with the gate 37, to provide the inverse current channel during ON operation of the high voltage device 300.

Still referring to FIGS. 3A to 3C, the source 38 and the drain 39 have the first conductivity type. The source 38 and the drain 39 are formed in the operation region 33a, beneath the top surface 31a and in contact with the top surface 31a in the vertical direction; the source 38 and the drain 39 are located outside and beneath the gate 37, and respectively at two lateral sides of the gate 37, wherein the source 38 is located in the body region 36 and the drain 39 is located in the well region 32 at a location which is away from the body region 36 in the channel direction. The drift region 32a is located between the drain 39 and the buffer region 35 in the channel direction, in the well region 32 and is near the top surface 31a, to serve as the drift current channel during ON operation of the high voltage device 300. The source 38 and the drain 39 are located beneath the top surface 31a and in contact with the top surface 31 in the vertical direction.

This embodiment differs from the first embodiment in that, in the first embodiment, the drift oxide region 24 is a LOCOS structure, while in the present embodiment, the drift oxide region 34 is a chemical vapor deposition (CVD) oxide region. The CVD oxide region is formed by a CVD process step, which is known to a person having ordinary skill in the art, so the details thereof are not redundantly explained here.

Figure 4A:
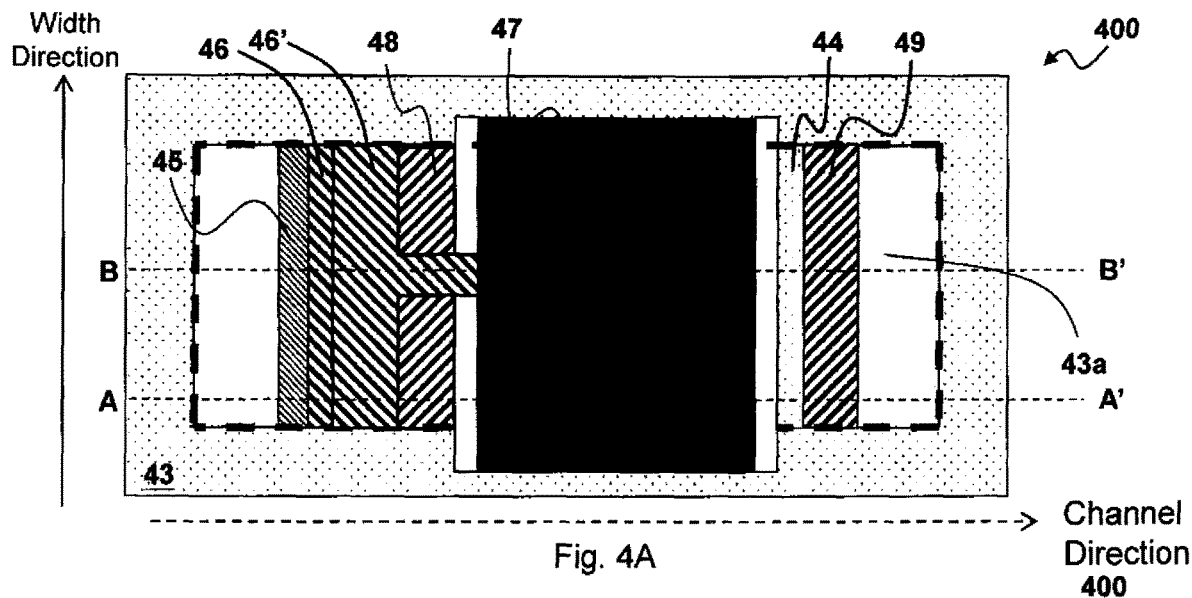
FIGS. 4A to 4C show a third embodiment of the present invention.
Figure 4B:
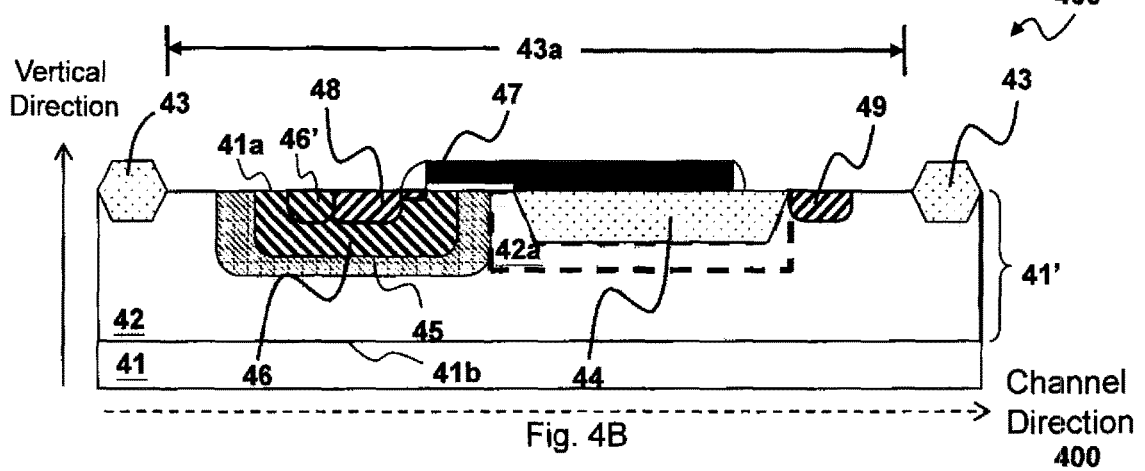
Figure 4C:
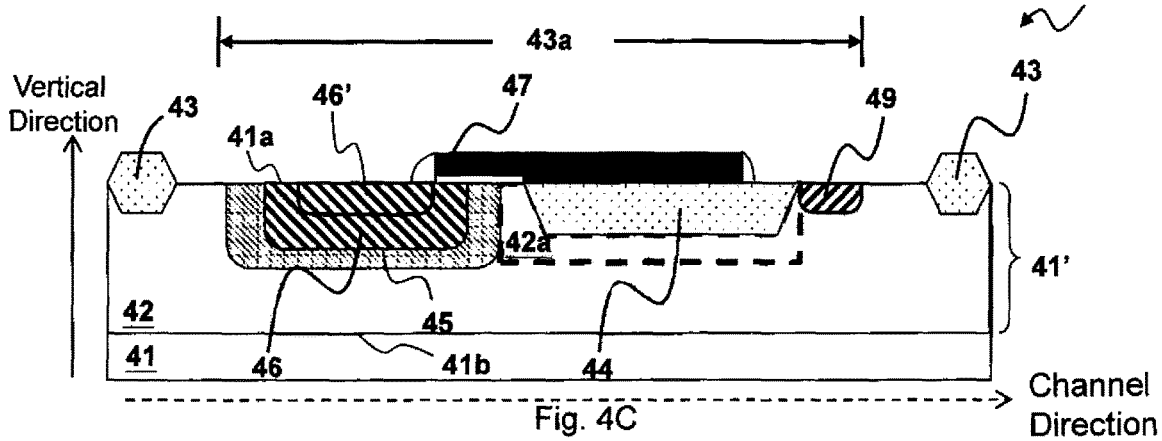

Please refer to FIGS. 4A to 4C, which show a third embodiment of the present invention. FIGS. 4A, 4B and 4C respectively show a top view, a cross-section view according to the cross-section line AA' and a cross-section view according to the cross-section line BB' of a high voltage device 400. As shown in FIGS. 4A to 4C, the high voltage device 400 includes a semiconductor layer 41', a well region 42, an isolation structure 43, a drift oxide region 44, a buffer region 45, a body region 46, a body electrode 46', a gate 47, a source 48, and a drain 49. The semiconductor layer 41' which is formed on the substrate 41 has a top surface 41a and a bottom surface 41b that is opposite to the top surface 41a in the vertical direction (as indicated by the direction of the solid arrow in FIGS. 4B and 4C). The substrate 41 is, for example but not limited to, a P-type or N-type semiconductor silicon substrate. The semiconductor layer 41', for example, is formed on the substrate 41 by epitaxy, or a part of the substrate 41 forms the semiconductor layer 41'. The method of forming the semiconductor layer 41' is known to a person having ordinary skill in the art, so the details thereof are not redundantly explained here Still referring to FIGS. 4A to 4C, the isolation structure 43 is formed on and in contact with the top surface 41a, for defining an operation region 43a (as indicated by the dashed line frame in FIG. 4A). The isolation structure 43 is not limited to the local oxidation of silicon (LOCOS) structure as shown in FIGS. 4B and 4C, and it may be a shallow trench isolation (STI) structure instead. The drift oxide region 44 is formed on and in contact with the top surface 41a, and is located on the drift region 42a in the operation region 43a (as indicated by the dashed line frame in FIGS. 4B and 4C) and in contact with the drift region 42a.

The well region 42 which has a first conductivity type is formed in the operation region 43a of the semiconductor layer 41', and the well region 42 is located beneath the top surface 41a and in contact with the top surface 41a in the vertical direction. The body region 46 which has a second conductivity type is formed in the well region 42 in the operation region 43*a*; the body region 46 is located beneath the top surface 41*a* and in contact with the top surface 41*a* in the vertical direction, and the body region 46 has a first impurity concentration of the second conductivity type impurities. The body electrode 46' which has the second conductivity type serves as an electrical contact of the body region 46. The body electrode 46' is formed in the body region 46, beneath the top surface 41*a* and in contact with the top surface 41*a* in the vertical direction. Similar to the top view at the lower part of FIG. 2A, the body electrode 46' includes a main body electrode and at least one sub-body electrode. As shown by FIG. 4A, the main body electrode is adjacent to the source 48, and the main body electrode and the source 48 are substantially rectangles extending along a width direction (as indicated by the direction of the solid arrow in FIG. 4A), wherein the source 48 is located between the main body electrode and the gate 47. The sub-body electrode extends from a part of the main body electrode toward the gate 47 in a channel direction (as indicated by the direction of the dashed arrow in FIGS. 4A to 4C), and is in contact with the inverse current channel. The buffer region 45 which has the second conductivity type is formed in the well region 42 in the operation region 43*a*, and the buffer region 45 is located beneath the top surface 41*a* and in contact with the top surface 41*a* in the vertical direction. The buffer region 45 encompasses all the periphery of the body regions 46 below the top surface 41*a* of the semiconductor layer 41'; the buffer region 45 has a second impurity concentration of the second conductivity type impurities, which is lower than the first impurity concentration. The gate 47 is formed on the top surface 41*a* in the operation region 43*a*. Viewing from the top view, the gate 47 is substantially a rectangle that extends along the width direction. In the vertical direction, a portion of the body region 46 and a portion of the buffer 45 are located beneath the gate 47 and in contact with the gate 47, to provide the inverse current channel during ON operation of the high voltage device 400.

Still referring to FIGS. 4A to 4C, the source 48 and the drain 49 have the first conductivity type. The source 48 and the drain 49 are formed beneath the top surface 41*a* and in contact with the top surface 41*a* in the operation region 43*a* in the vertical direction, and the source 48 and the drain 49 are located outside and beneath the gate 47, and respectively at two lateral sides of the gate 47, wherein the source 48 is located in the body region 46 and the drain 49 is located in the well region 42 relatively farther to the body region 46 in the channel direction, and the drift region 42*a* is located between the drain 49 and the buffer region 45 in the channel direction, and is adjacent to the top surface 41*a* in the well region 42 to serve as the drift current channel during ON operation of the high voltage device 400. The source 48 and the drain 49 are located beneath the top surface 41*a* and in contact with the top surface 41 in the vertical direction.

This embodiment differs from the first embodiment in that, in the first embodiment, the drift oxide region 24 is a LOCOS structure, while in the present embodiment, the drift oxide region 44 is a shallow trench isolation (STI) structure. The STI structure is known to a person having ordinary skill in the art, so the details thereof are not redundantly explained here.

Figure 5A:
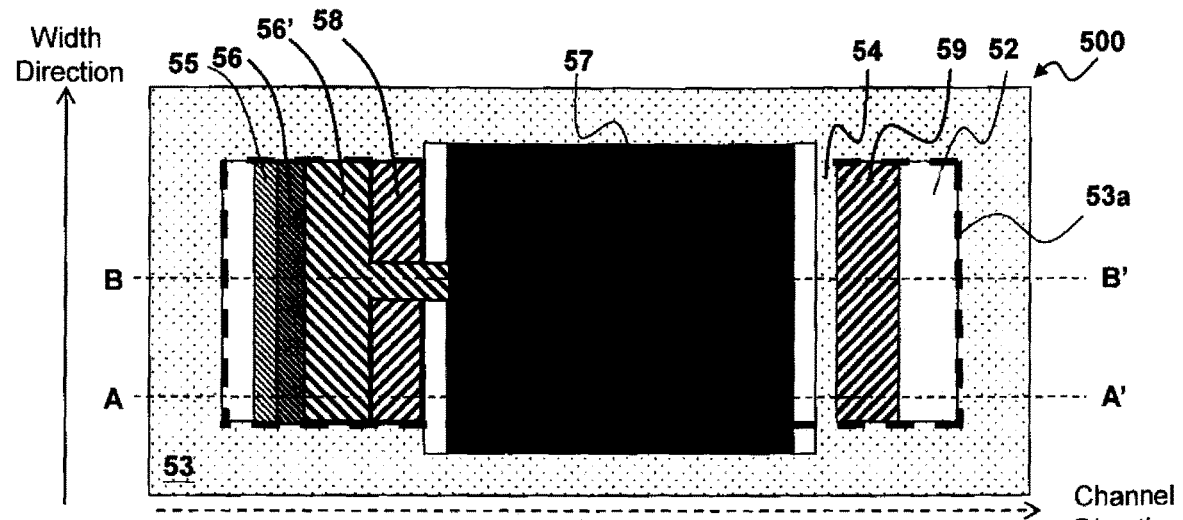
FIGS. 5A to 5C show a fourth embodiment of the present invention.
Figure 5B:
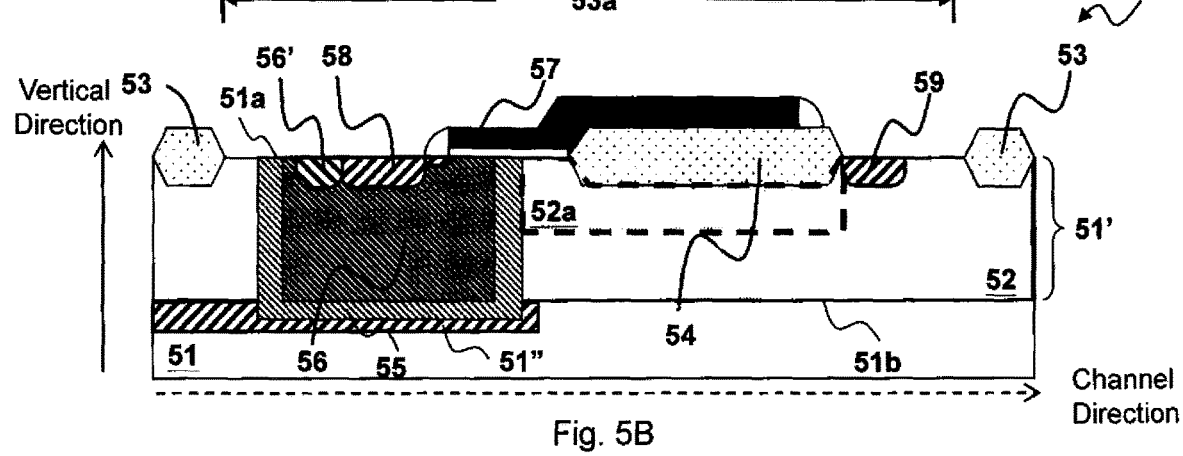
Figure 5C:
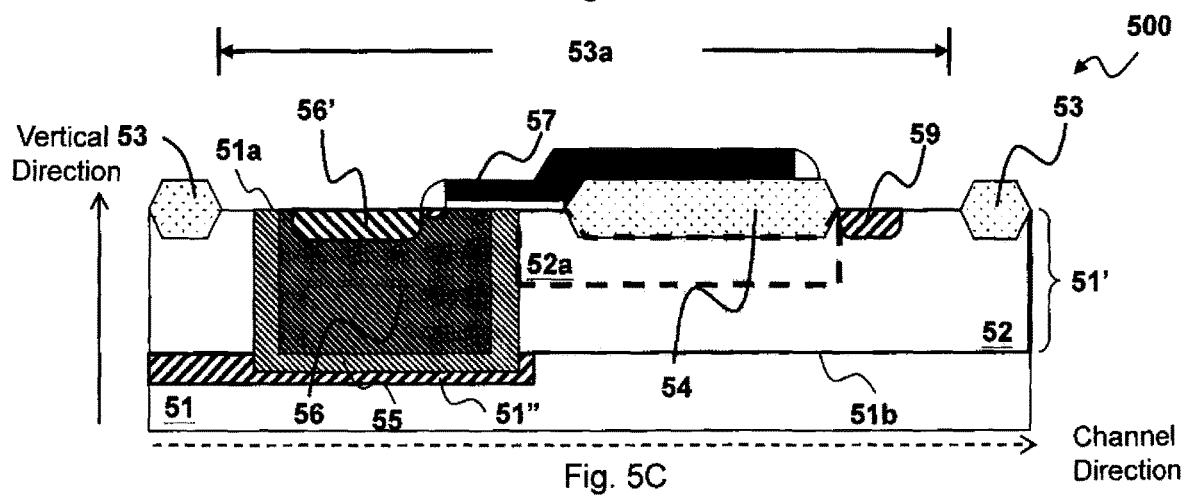

Please refer to FIGS. 5A to 5C, which show a fourth embodiment of the present invention. FIGS. 5A, 5B and 5C respectively show a top view, a cross-section view according to the cross-section line AA' and a cross-section view according to the cross-section line BB' of a high voltage device 500. As shown in FIGS. 5A to 5C, the high voltage device 500 includes a semiconductor layer 51', a buried layer 51'', a drift well region 52, an isolation structure 53, a drift oxide region 54, a buffer region 55, a channel well region 56, a channel well region contact 56', a gate 57, a source 58, and a drain 59. The semiconductor layer 51' which is formed on the substrate 51 has a top surface 51*a* and a bottom surface 51*b* that is opposite to the top surface 51*a* in the vertical direction (as indicated by the direction of the solid arrow in FIGS. 5B and 5C). The substrate 51 is, for example but not limited to, a P-type or N-type semiconductor silicon substrate. The semiconductor layer 51', for example, is formed on the substrate 51 by epitaxy, or a part of the substrate 51 forms the semiconductor layer 51'. The method of forming the semiconductor layer 51' is known to a person having ordinary skill in the art, so the details thereof are not redundantly explained here.

Still referring to FIGS. 5A to 5C, the isolation structure 53 is formed on and in contact with the top surface 51*a*, for defining an operation region 53*a* (as indicated by the dashed line frame in FIG. 5A). The isolation structure 53 is not limited to the local oxidation of silicon (LOCOS) structure as shown in FIGS. 5B and 5C, and it may be a shallow trench isolation (STI) structure instead. The drift oxide region 54 is formed on and in contact with the top surface 51*a*, and is located on the drift region 52*a* in the operation region 53*a* (as indicated by the dashed line frame in FIGS. 5B and 5C) and in contact with the drift region 52*a*.

The drift well region 52 which has the first conductivity type is formed in the operation region 53*a* of the semiconductor layer 51', and the drift well region 52 is located beneath the top surface 51*a* and in contact with the top surface 51*a* in the vertical direction. The channel well region 56 which has the second conductivity type is formed in the operation region 53*a*; the channel well region 56 is located beneath the top surface 51*a* and in contact with the top surface 51*a* in the vertical direction, and the channel well region 56 has a first impurity concentration of the second conductivity type impurities. The channel well region contact 56' which has the second conductivity type serves as an electrical contact of the channel well region 56. The channel well region contact 56' is formed in the channel well region 56, beneath the top surface 51*a* and in contact with the top surface 51*a* in the vertical direction. Similar to the top view at the lower part of FIG. 2A, the channel well region contact 56' includes a main channel well region contact and at least one sub-channel well region contact. Viewing from top view, the main channel well region contact is adjacent to the source 58, and the main channel well region contact and the source 58 are substantially rectangles extending along the width direction (as indicated by the direction of the solid arrow in FIG. 5A), wherein the source 58 is located between the main channel well region contact and the gate 57. The sub-channel well region contact extends from a part of the main channel well region contact toward the gate 57 in the channel direction (as indicated by the direction of the dashed arrow in FIGS. 5A to 5C), and is in contact with the inverse current channel. The buffer region 55 which has the second conductivity type is formed in the operation region 53*a*, and the buffer region 55 is located beneath the top surface 51*a* and in contact with the top surface 51*a* in the vertical direction; the buffer region 55 encompasses all the periphery of the channel well region 56 below the top surface 51*a* of the semiconductor layer 51', and the buffer region 55 has a second impurity concentration of the second conductivity type impurities, which is lower than the first impurity concentration. The buffer region 55 is in contact with the drift well region 52 in the channel direction. The gate 57 is formed on the top surface 51*a* in the operation region 53*a*.

From top view, the gate 57 is substantially a rectangle that extends along the width direction, and in the vertical direction, a portion of the channel well region 56 and a portion of the buffer 55 are located beneath the gate 57 and in contact with the gate 57 to provide the inverse current channel during ON operation of the high voltage device 500.

Still referring to FIGS. 5A to 5C, the source 58 and the drain 59 have the first conductivity type. The source 58 and the drain 59 are formed in the operation region 53a, beneath the top surface 51a and in contact with the top surface 51a in the vertical direction; the source 58 and the drain 59 are located outside and beneath the gate 57, and respectively at two lateral sides of the gate 57, wherein the source 58 is located in the channel well region 56 and the drain 59 is located in the drift well region 52 at a location which is away from the channel well region 56 in the channel direction. The drift region 52a is located between the drain 59 and the buffer region 55 in the channel direction, in the well region 52 and is near the top surface 51a, to serve as the drift current channel during ON operation of the high voltage device 500. The source 58 and the drain 59 are located beneath the top surface 51a and in contact with the top surface 51 in the vertical direction. The buried layer 51" which has the first conductivity type is formed under the channel well region 56 and in contact with the channel well region 56 in the vertical direction, and the buried layer 51" completely covers the portion of the channel well region 56 in the operation region 53a. In the vertical direction, the buried layer 51" is formed, for example, at both sides of the junction between the substrate 51 and the semiconductor layer 51', i.e., a portion of the buried layer 51" is located in the substrate 51, and a portion of the buried layer 51" is located in the semiconductor layer 51'.

Figure 6A:
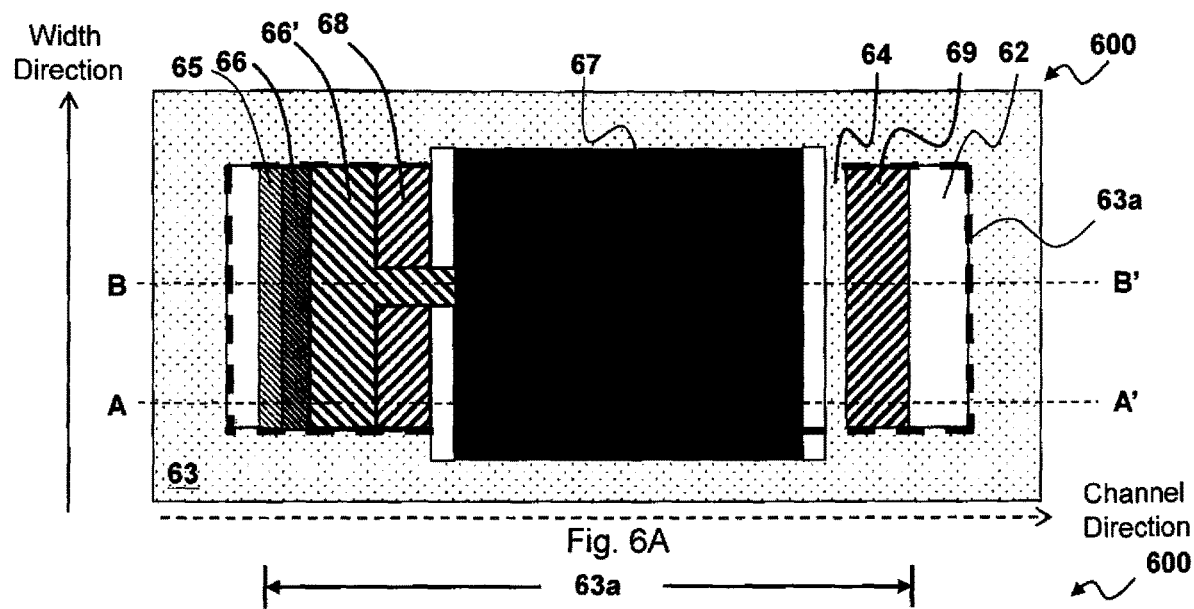
FIGS. 6A to 6C show a fifth embodiment of the present invention.
Figure 6B:
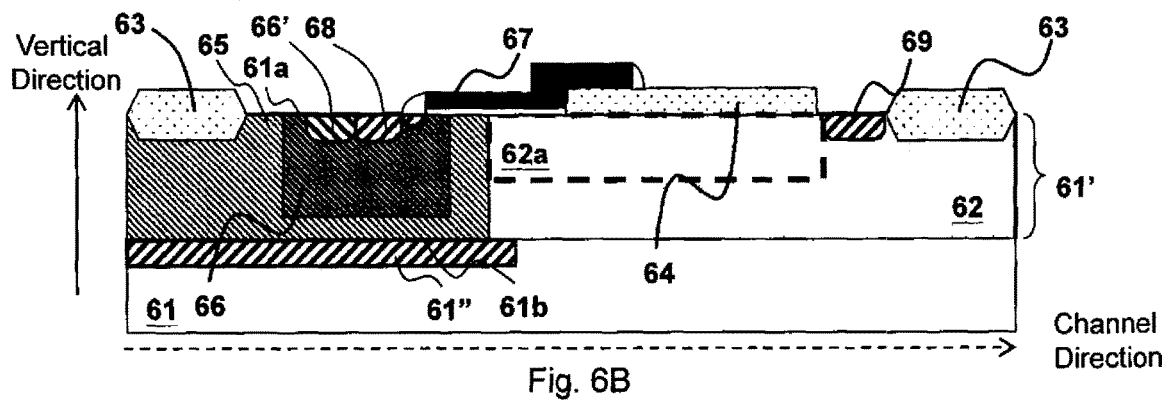
Figure 6C:
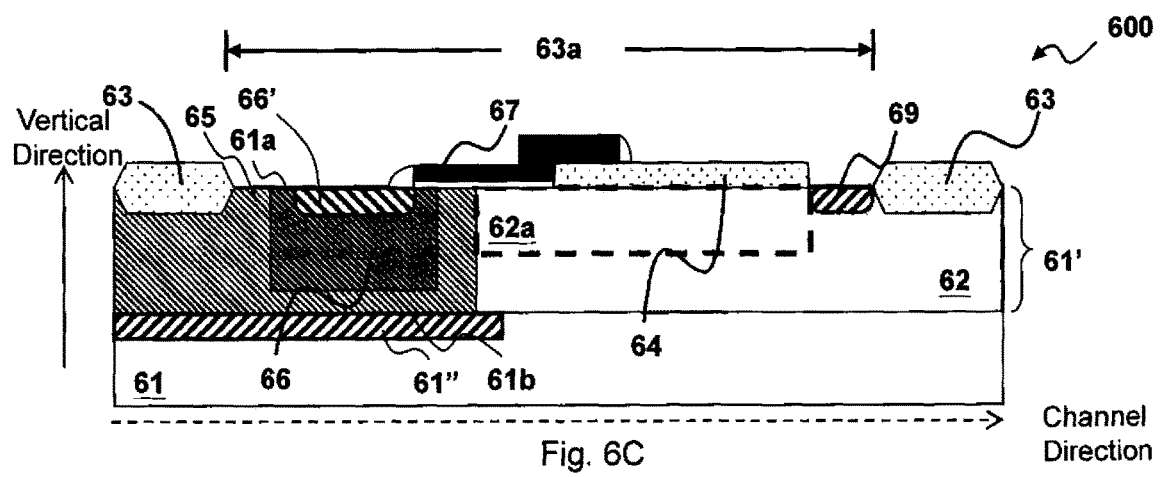

FIGS. 6A to 6C show a fifth embodiment of the present invention. FIGS. 6A, 6B and 6C respectively show a top view, a cross-section view according to the cross-section line AA' and a cross-section view according to the cross-section line BB' of a high voltage device 600. As shown in FIGS. 6A to 6C, the high voltage device 600 includes a semiconductor layer 61', a buried layer 61", a drift well region 62, an isolation structure 63, a drift oxide region 64, a buffer region 65, a channel well region 66, a channel well region contact 66', a gate 67, a source 68, and a drain 69. The semiconductor layer 61' which is formed on the substrate 61 has a top surface 61a and a bottom surface 61b that is opposite to the top surface 61a in the vertical direction (as indicated by the direction of the solid arrow in FIGS. 6B and 6C). The substrate 61 is, for example but not limited to, a P-type or N-type semiconductor silicon substrate. The semiconductor layer 61', for example, is formed on the substrate 61 by epitaxy, or a part of the substrate 61 forms the semiconductor layer 61'. The method of forming the semiconductor layer 61' is known to a person having ordinary skill in the art, so the details thereof are not redundantly explained here.

Still referring to FIGS. 6A to 6C, the isolation structure 63 is formed on and in contact with the top surface 61a, for defining an operation region 63a (as indicated by the dashed line frame in FIG. 6A). The isolation structure 63 is not limited to the local oxidation of silicon (LOCOS) structure as shown in FIGS. 6B and 6C, and it may be a shallow trench isolation (STI) structure instead. The drift oxide region 64 is formed on and in contact with the top surface 61a, and is located on the drift region 62a in the operation region 63a (as indicated by the dashed line frame in FIGS. 6B and 6C) and in contact with the drift region 62a.

The drift well region 62 which has the first conductivity type is formed in the operation region 63a of the semiconductor layer 61', and the drift well region 62 is located beneath the top surface 61a and in contact with the top surface 61a in the vertical direction. The channel well region 66 which has the second conductivity type is formed in the operation region 63a; the channel well region 66 is located beneath the top surface 61a and in contact with the top surface 61a in the vertical direction, and the channel well region 66 has a first impurity concentration of the second conductivity type impurities. The channel well region contact 66' which has the second conductivity type serves as an electrical contact of the channel well region 66. The channel well region contact 66' is formed in the channel well region 66, beneath the top surface 61a and in contact with the top surface 61a in the vertical direction. Similar to the top view at the lower part of FIG. 2A, the channel well region contact 66' includes a main channel well region contact and at least one sub-channel well region contact. Viewing from top view, the main channel well region contact is adjacent to the source 68, and the main channel well region contact and the source 68 are substantially rectangles extending along the width direction (as indicated by the direction of the solid arrow in FIG. 6A), wherein the source 68 is located between the main channel well region contact and the gate 67. The sub-channel well region contact extends from a part of the main channel well region contact toward the gate 67 in the channel direction (as indicated by the direction of the dashed arrow in FIGS. 6A to 6C), and is in contact with the inverse current channel. The buffer region 65 which has the second conductivity type is formed in the operation region 63a, and the buffer region 65 is located beneath the top surface 61a and in contact with the top surface 61a in the vertical direction; the buffer region 65 encompasses all the periphery of the channel well region 66 below the top surface 61a of the semiconductor layer 61', and the buffer region 65 has a second impurity concentration of the second conductivity type impurities, which is lower than the first impurity concentration. The buffer region 65 is in contact with the drift well region 62 in the channel direction. The gate 67 is formed on the top surface 61a in the operation region 63a. From top view, the gate 67 is substantially a rectangle that extends along the width direction, and in the vertical direction, a portion of the channel well region 66 and a portion of the buffer 65 are located beneath the gate 67 and in contact with the gate 67 to provide the inverse current channel during ON operation of the high voltage device 600.

Still referring to FIGS. 6A to 6C, the source 68 and the drain 69 have the first conductivity type. The source 68 and the drain 69 are formed in the operation region 63a, beneath the top surface 61a and in contact with the top surface 61a in the vertical direction; the source 68 and the drain 69 are located outside and beneath the gate 67, and respectively at two lateral sides of the gate 67, wherein the source 68 is located in the channel well region 66 and the drain 69 is located in the drift well region 62 at a location which is away from the channel well region 66 in the channel direction. The drift region 62a is located between the drain 69 and the buffer region 65 in the channel direction, in the well region 62 and is near the top surface 61a, to serve as the drift current channel during ON operation of the high voltage device 600. The source 68 and the drain 69 are located beneath the top surface 61a and in contact with the top surface 61 in the vertical direction. The buried layer 61" which has the first conductivity type is formed under the channel well region 66 and in contact with the channel well region 66 in the vertical direction, and the buried layer 61" completely covers the portion of the channel well region 66 in the operation region 63a. In the vertical direction, the buried layer 61" is formed, for example, at both sides of the junction between the substrate 61 and the semiconductor layer 61', i.e., a portion of the buried layer 61" is located in the substrate 61, and a portion of the buried layer 61" is located in the semiconductor layer 61'.

This embodiment differs from the fourth embodiment in that, in the fourth embodiment, the drift oxide region 54 is a LOCOS structure, and in the present embodiment, the drift oxide region 64 is a chemical vapor deposition (CVD) oxide region. The CVD oxide region is formed by a CVD process step, which is known to a person having ordinary skill in the art, so the details thereof are not redundantly explained here.

Figure 7A:
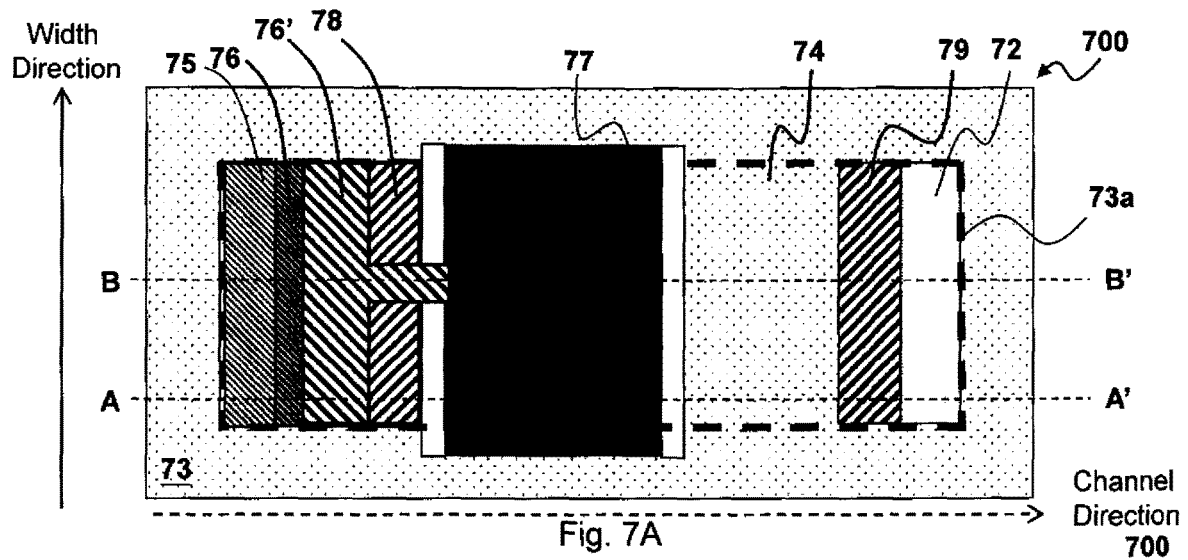
FIGS. 7A to 7C show a sixth embodiment of the present invention.
Figure 7B:
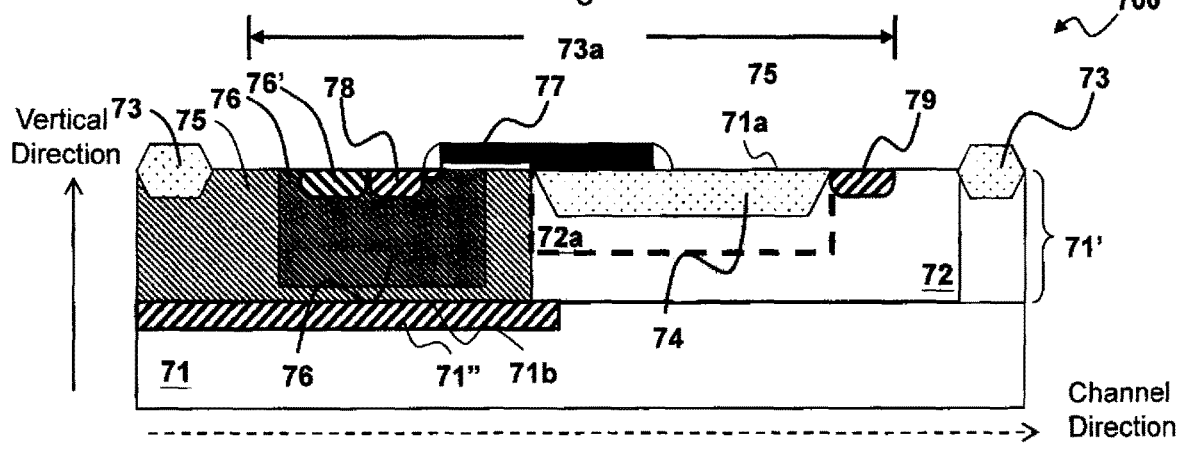
Figure 7C:
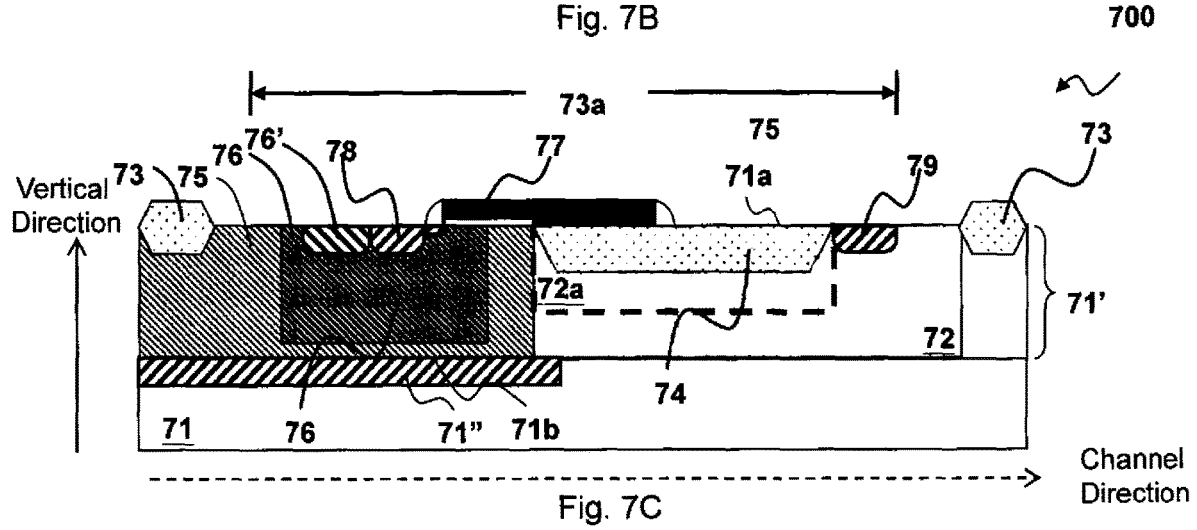

FIGS. 7A to 7C show a sixth embodiment of the present invention. FIGS. 7A, 7B and 7C respectively show a top view, a cross-section view according to the cross-section line AA' and a cross-section view according to the cross-section line BB' of a high voltage device 700. As shown in FIGS. 7A to 7C, the high voltage device 700 includes a semiconductor layer 71', a buried layer 71", a drift well region 72, an isolation structure 73, a drift oxide region 74, a buffer region 75, a channel well region 76, a channel well region contact 76', a gate 77, a source 78, and a drain 79. The semiconductor layer 71' which is formed on the substrate 71 has a top surface 71a and a bottom surface 71b that is opposite to the top surface 71a in the vertical direction (as indicated by the direction of the solid arrow in FIGS. 7B and 7C). The substrate 71 is, for example but not limited to, a P-type or N-type semiconductor silicon substrate. The semiconductor layer 71', for example, is formed on the substrate 71 by epitaxy, or a part of the substrate 71 forms the semiconductor layer 71'. The method of forming the semiconductor layer 71' is known to a person having ordinary skill in the art, so the details thereof are not redundantly explained here.

Still referring to FIGS. 7A to 7C, the isolation structure 73 is formed on and in contact with the top surface 71a, for defining an operation region 73a (as indicated by the dashed line frame in FIG. 7A). The isolation structure 73 is not limited to the local oxidation of silicon (LOCOS) structure as shown in FIGS. 7B and 7C, and it may be a shallow trench isolation (STI) structure instead. The drift oxide region 74 is formed on and in contact with the top surface 71a, and is located on the drift region 72a in the operation region 73a (as indicated by the dashed line frame in FIGS. 7B and 7C) and in contact with the drift region 72a.

The drift well region 72 which has the first conductivity type is formed in the operation region 73a of the semiconductor layer 71', and the drift well region 72 is located beneath the top surface 71a and in contact with the top surface 71a in the vertical direction. The channel well region 76 which has the second conductivity type is formed in the operation region 73a; the channel well region 76 is located beneath the top surface 71a and in contact with the top surface 71a in the vertical direction, and the channel well region 76 has a first impurity concentration of the second conductivity type impurities. The channel well region contact 76' which has the second conductivity type serves as an electrical contact of the channel well region 76. The channel well region contact 76' is formed in the channel well region 76, beneath the top surface 71a and in contact with the top surface 71a in the vertical direction. Similar to the top view at the lower part of FIG. 2A, the channel well region contact 76' includes a main channel well region contact and at least one sub-channel well region contact. Viewing from top view, the main channel well region contact is adjacent to the source 78, and the main channel well region contact and the source 78 are substantially rectangles extending along the width direction (as indicated by the direction of the solid arrow in FIG. 7A), wherein the source 78 is located between the main channel well region contact and the gate 77. The sub-channel well region contact extends from a part of the main channel well region contact toward the gate 77 in the channel direction (as indicated by the direction of the dashed arrow in FIGS. 7A to 7C), and is in contact with the inverse current channel. The buffer region 75 which has the second conductivity type is formed in the operation region 73a, and the buffer region 75 is located beneath the top surface 71a and in contact with the top surface 71a in the vertical direction; the buffer region 75 encompasses all the periphery of the channel well region 76 below the top surface 71a of the semiconductor layer 71', and the buffer region 75 has a second impurity concentration of the second conductivity type impurities, which is lower than the first impurity concentration. The buffer region 75 is in contact with the drift well region 72 in the channel direction. The gate 77 is formed on the top surface 71a in the operation region 73a. From top view, the gate 77 is substantially a rectangle that extends along the width direction, and in the vertical direction, a portion of the channel well region 76 and a portion of the buffer 75 are located beneath the gate 77 and in contact with the gate 77 to provide the inverse current channel during ON operation of the high voltage device 700.

Still referring to FIGS. 7A to 7C, the source 78 and the drain 79 have the first conductivity type. The source 78 and the drain 79 are formed in the operation region 73a, beneath the top surface 71a and in contact with the top surface 71a in the vertical direction; the source 78 and the drain 79 are located outside and beneath the gate 77, and respectively at two lateral sides of the gate 77, wherein the source 78 is located in the channel well region 76 and the drain 79 is located in the drift well region 72 at a location which is away from the channel well region 76 in the channel direction. The drift region 72a is located between the drain 79 and the buffer region 75 in the channel direction, in the well region 72 and is near the top surface 71a, to serve as the drift current channel during ON operation of the high voltage device 700. The source 78 and the drain 79 are located beneath the top surface 71a and in contact with the top surface 71 in the vertical direction. The buried layer 71" which has the first conductivity type is formed under the channel well region 76 and in contact with the channel well region 76 in the vertical direction, and the buried layer 71" completely covers the portion of the channel well region 76 in the operation region 73a. In the vertical direction, the buried layer 71" is formed, for example, at both sides of the junction between the substrate 71 and the semiconductor layer 71', i.e., a portion of the buried layer 71" is located in the substrate 71, and a portion of the buried layer 71" is located in the semiconductor layer 71'.

This embodiment differs from the fourth embodiment in that, in the fourth embodiment, the drift oxide region 74 is a LOCOS structure, while in the present embodiment, the drift oxide region 74 is a shallow trench isolation (STI) structure. The STI structure is known to a person having ordinary skill in the art, so the details thereof are not redundantly explained here.

Figure 8A:
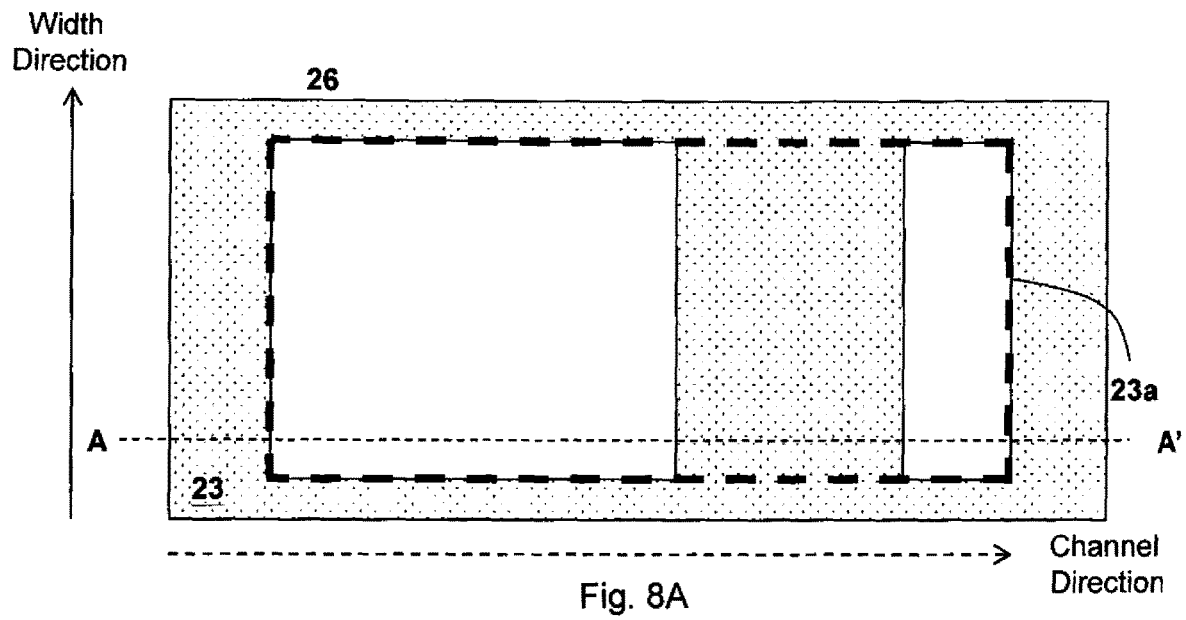
FIGS. 8A to 8O show a seventh embodiment of the present invention.
Figure 8B:
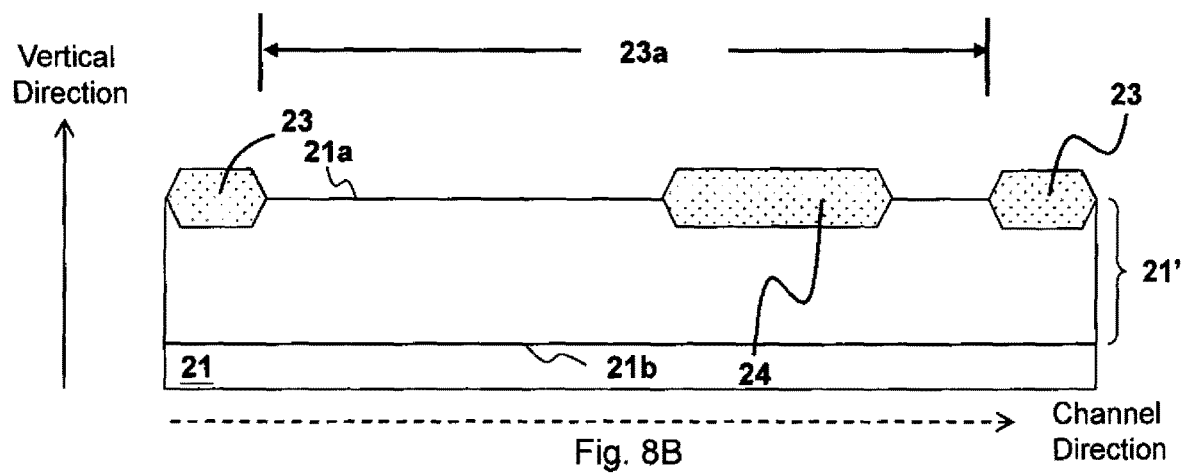
Figure 8C:
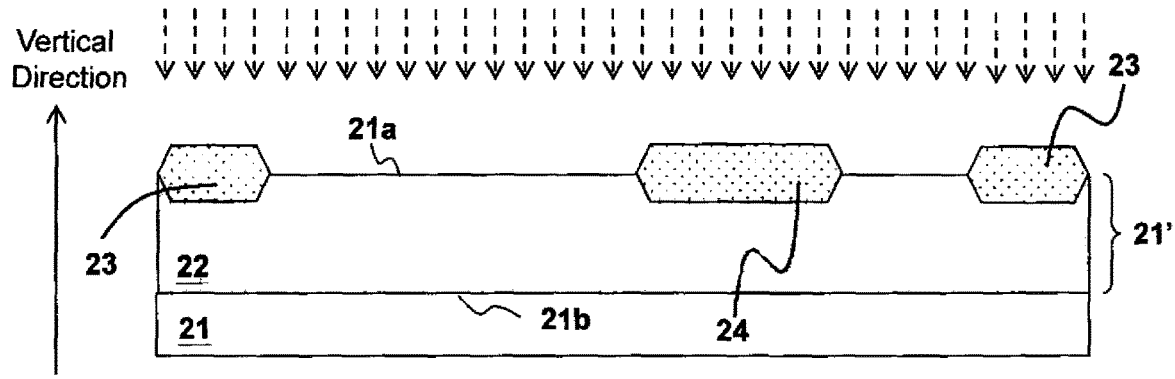
Figure 8D:
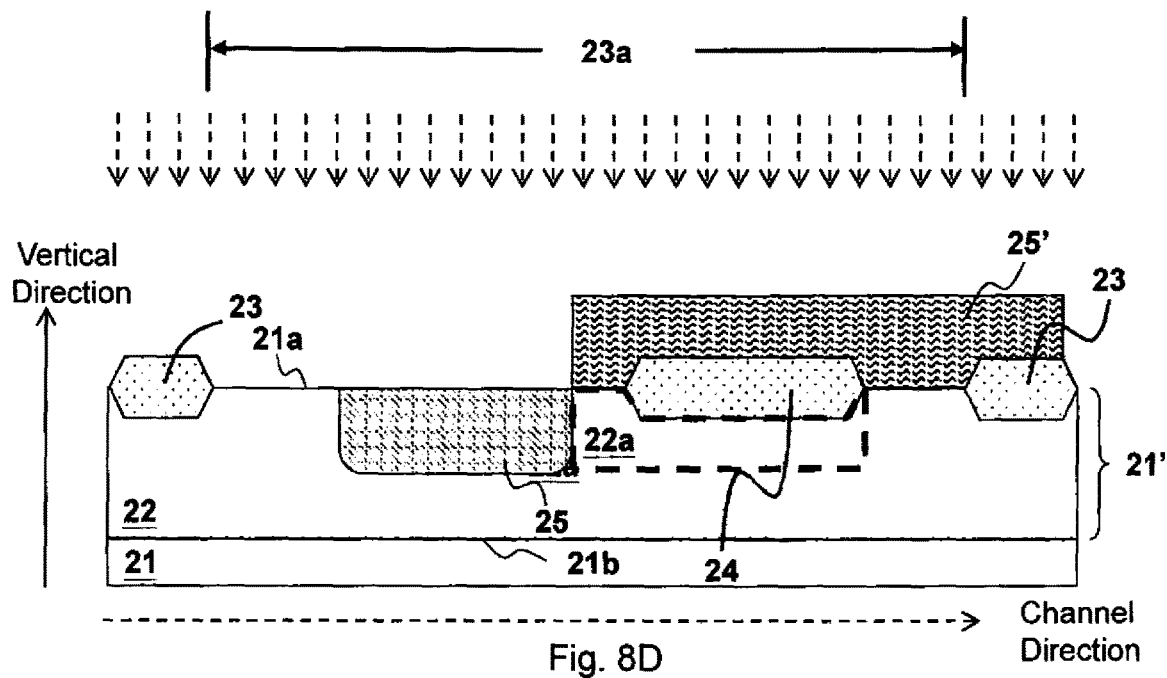
Figure 8E:
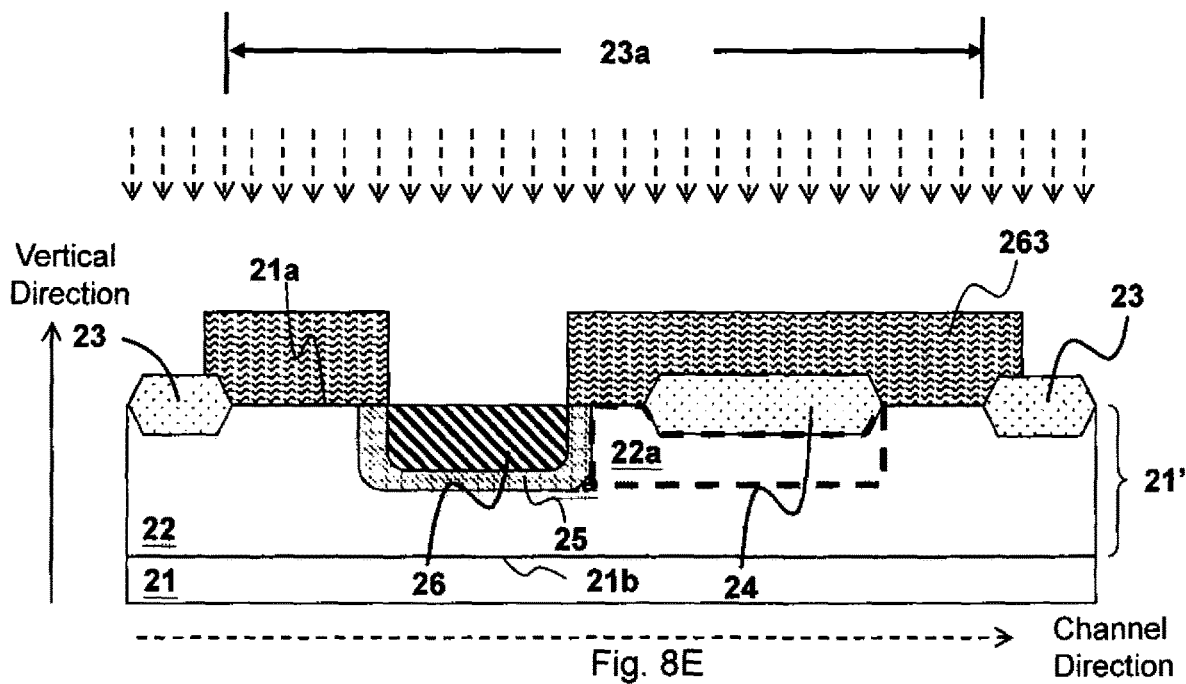
Figure 8F:
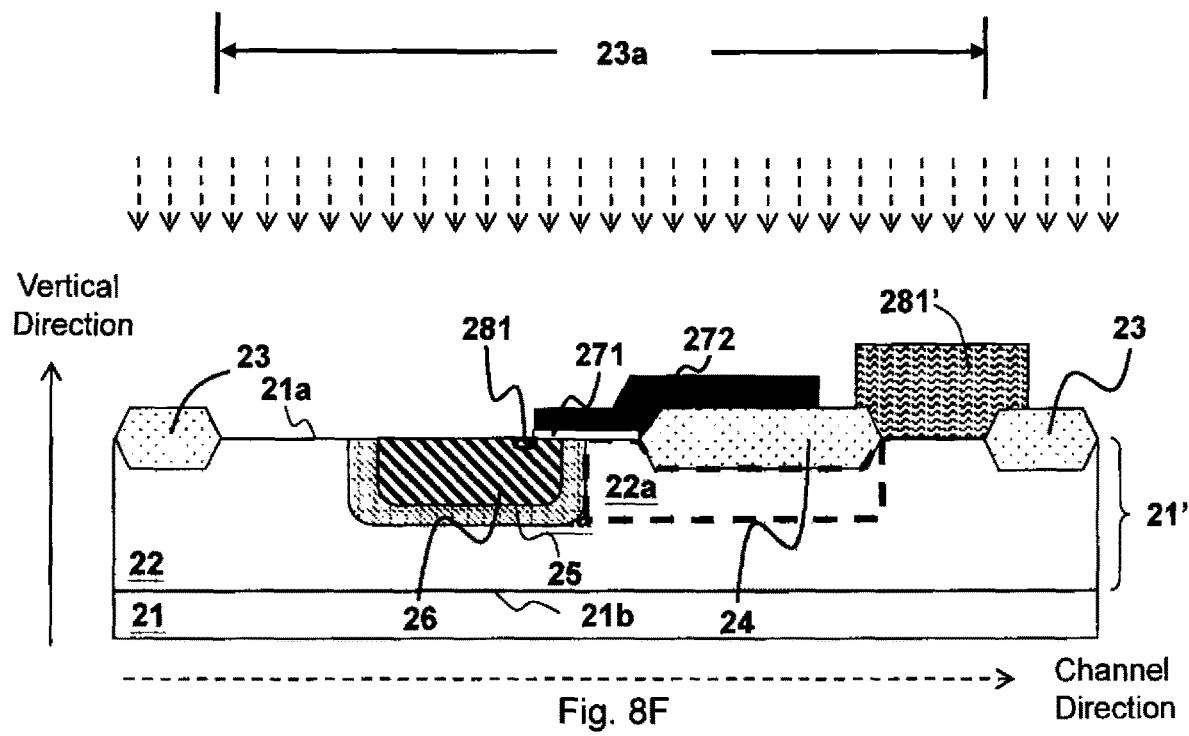
Figure 8G:
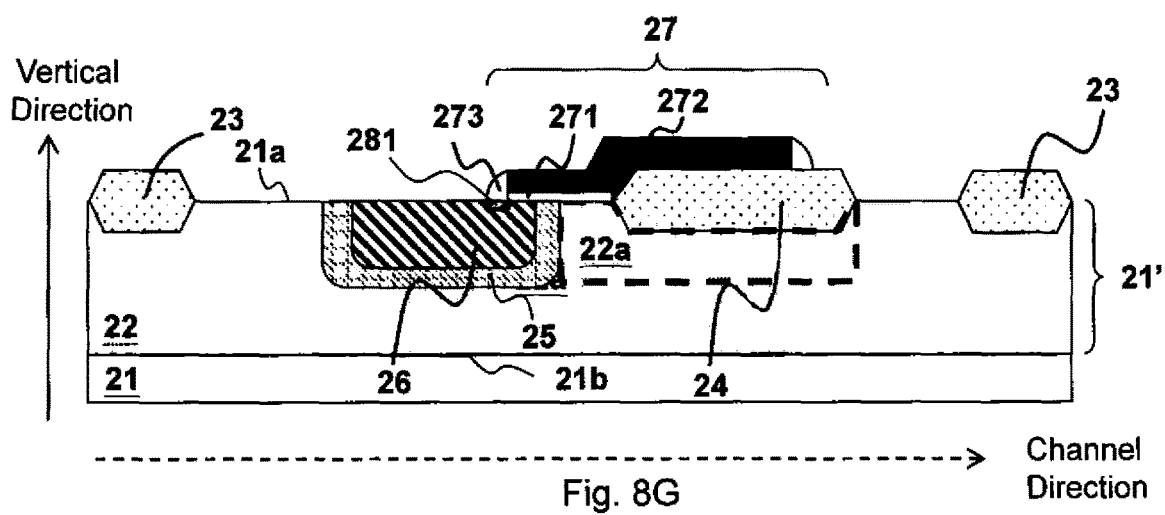
Figure 8H:
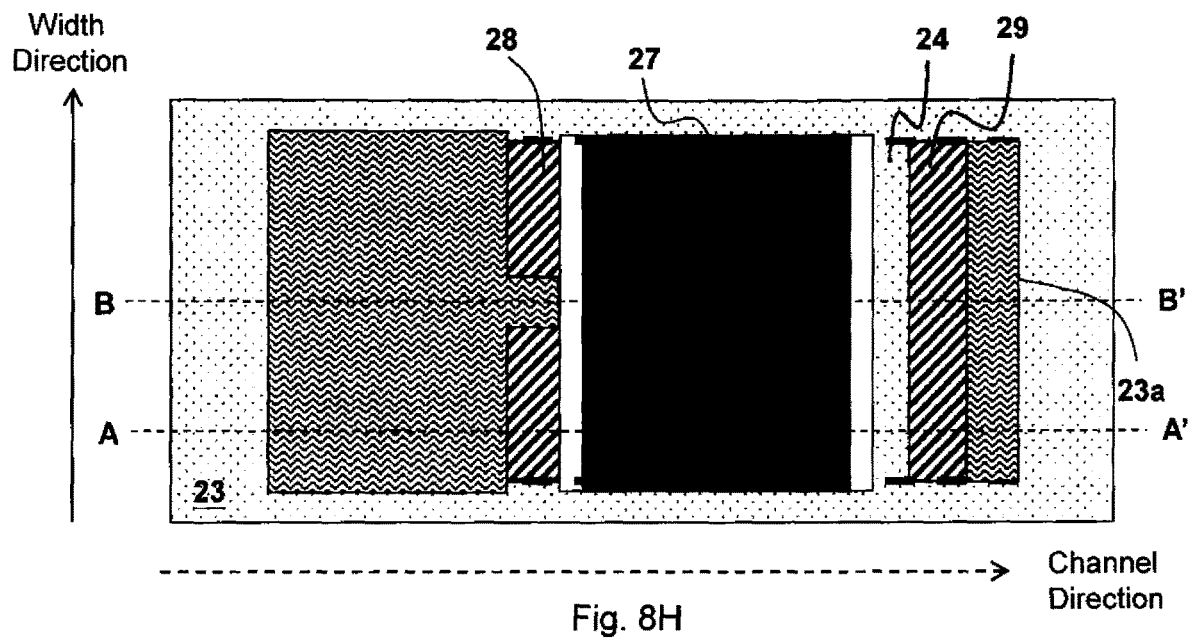
Figure 8I:
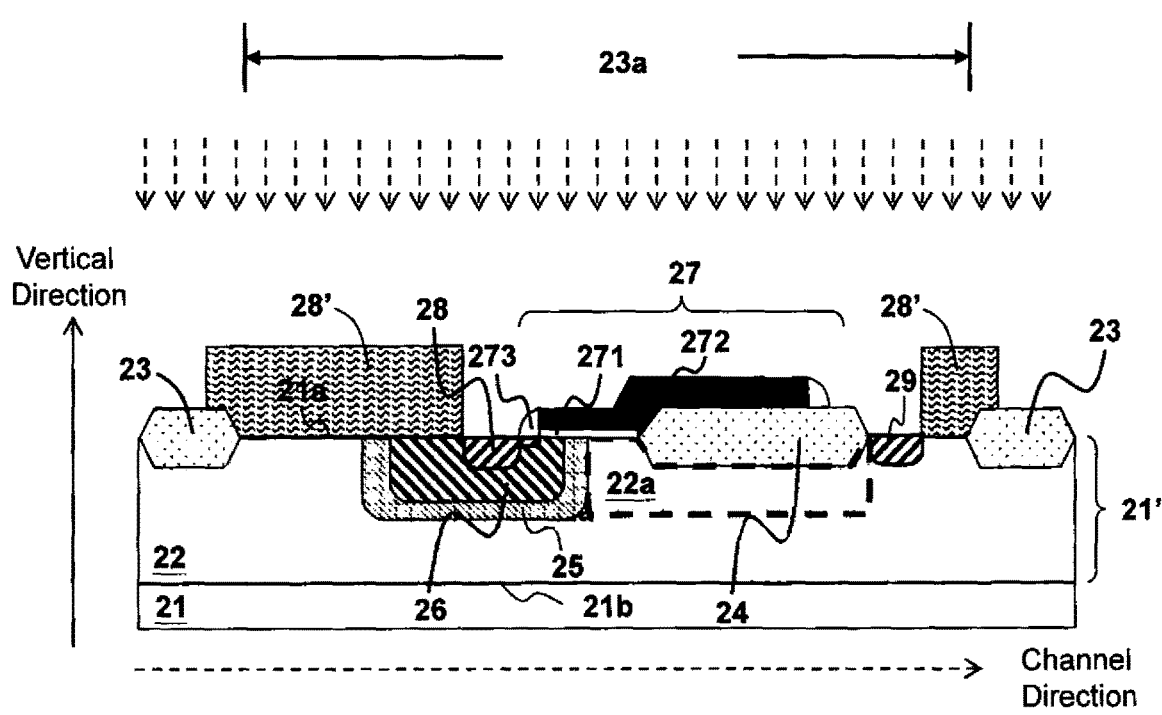
Figure 8J:
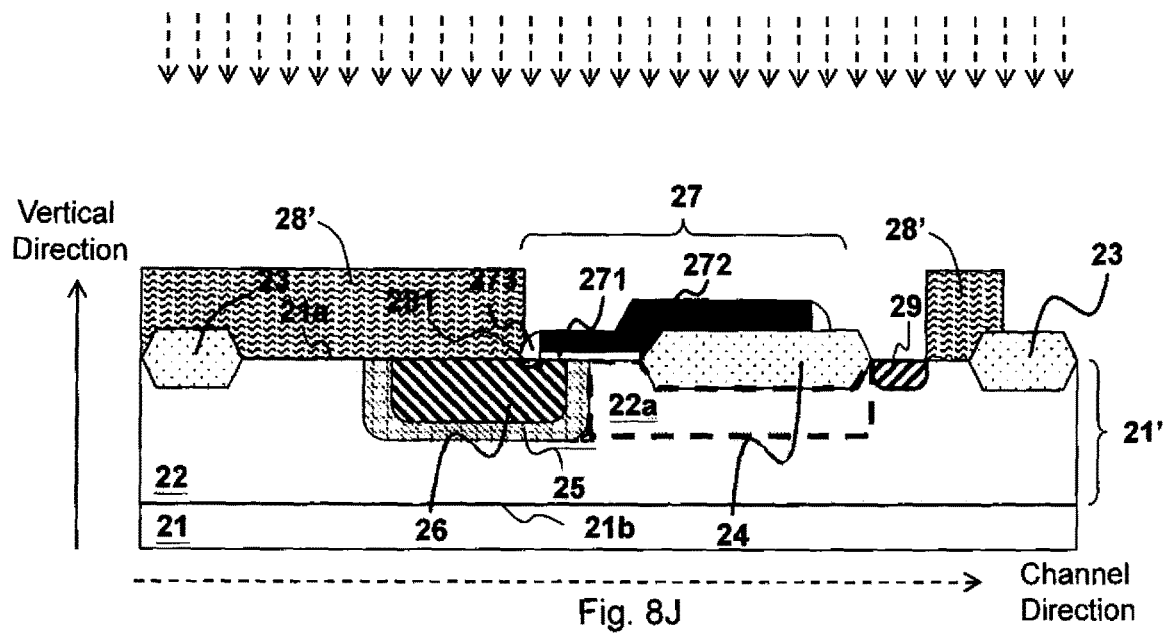
Figure 8K:
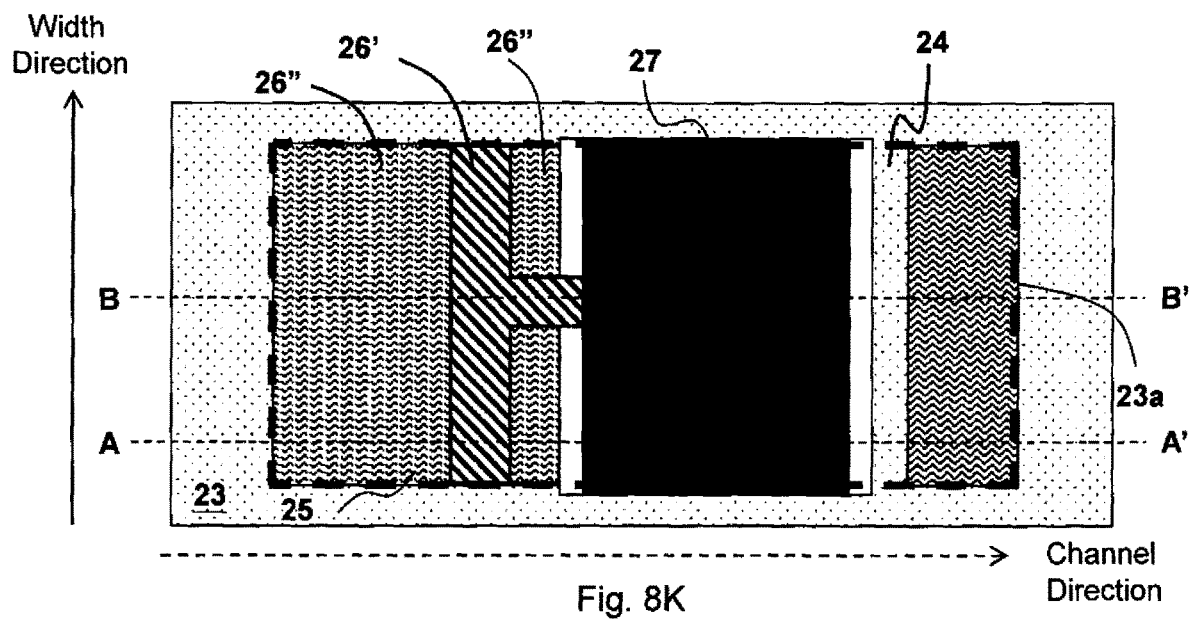
Figure 8L:
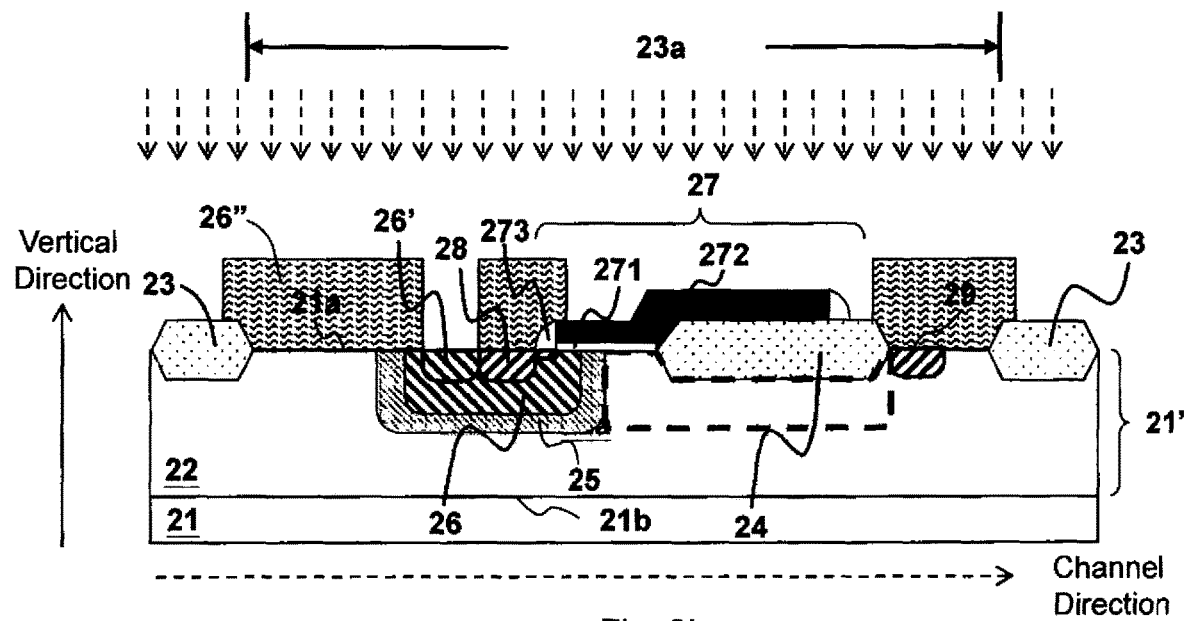
Figure 8M:
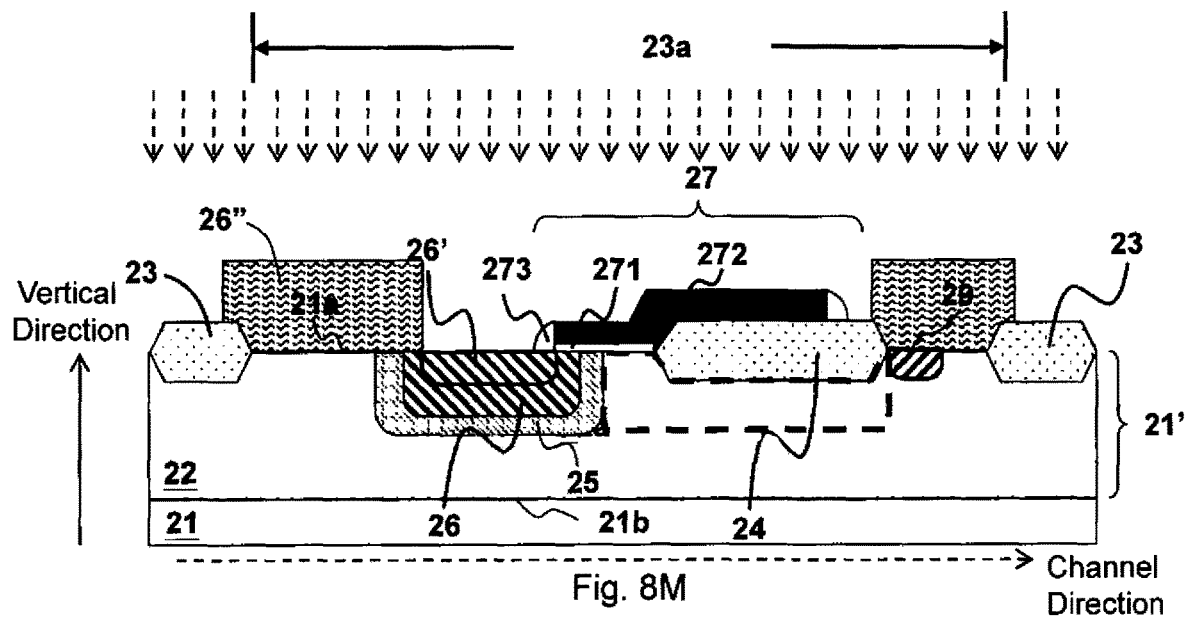
Figure 8N:
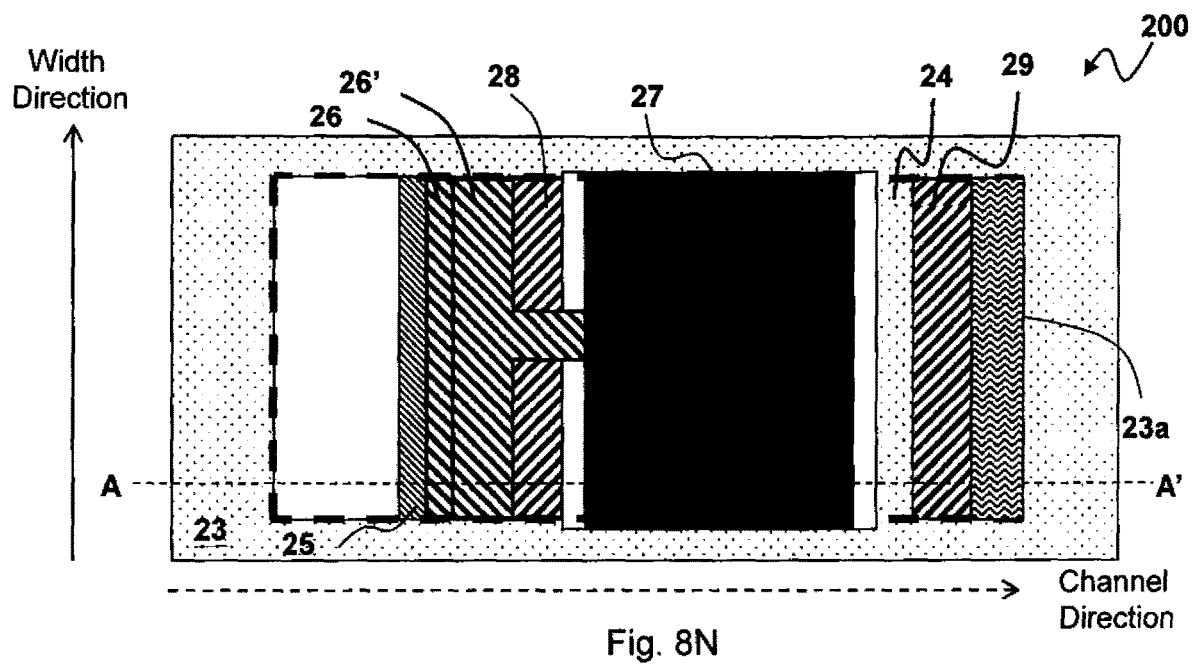
Figure 8O:
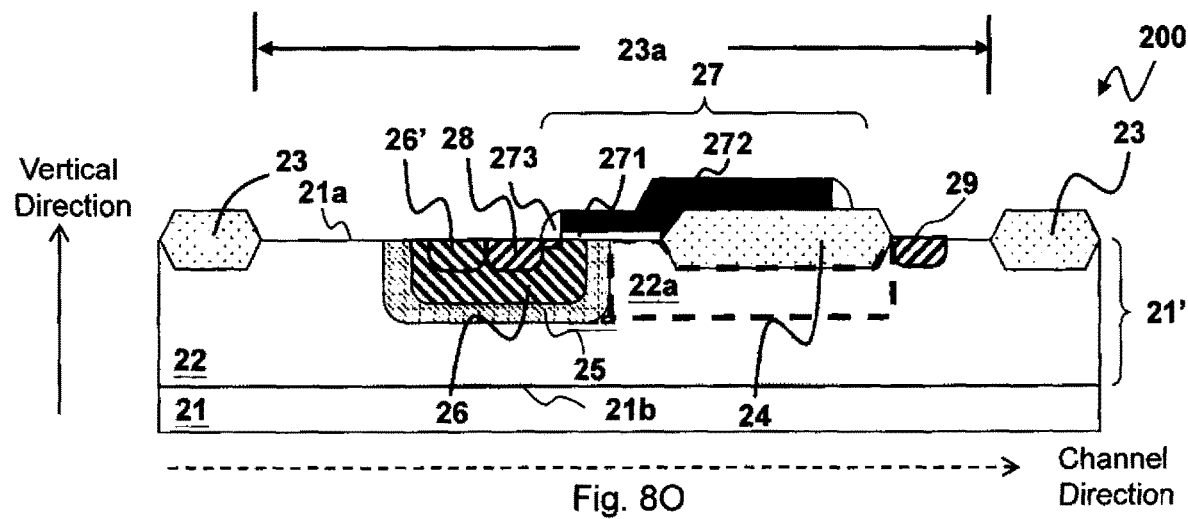

Please refer to FIGS. 8A to 8O, which show a seventh embodiment of the present invention. FIGS. 8A to 8O show cross-section views (FIGS. 8B-8G, 8I-8M and 8O) and top views (FIGS. 8A, 8H, 8K and 8N) of a manufacturing method of the high voltage device 200. As shown in FIGS. 8A and 8B, wherein FIG. 8B shows a cross-section view according to the cross-section line AA' of FIG. 8A, first, a semiconductor layer 21' is formed on a substrate 21; the semiconductor layer 21' has a top surface 21a and a bottom surface 21b that is opposite to the top surface 21a in the vertical direction (as indicated by the direction of the solid arrow in FIG. 8B). The substrate 21 is, for example but not limited to, a P-type or N-type semiconductor silicon substrate. The semiconductor layer 21', for example, is formed on the substrate 21 by epitaxy, or a part of the substrate 21 forms the semiconductor layer 21'. The method of forming the semiconductor layer 21' is known to a person having ordinary skill in the art, so the details thereof are not redundantly explained here.

Still referring to FIGS. 8A and 8B, next, an isolation structure 23 and a drift oxide region 24 are formed on the top surface 21a and in contact with the top surface 21a. The isolation structure 23 is for defining the operation 23a (as shown by the dashed line frame in FIG. 8A). The isolation structure 23 is not limited to the local oxidation of silicon (LOCOS) structure as shown in the figure, and may be a shallow trench isolation (STI) structure instead. The drift oxide region 24 is located on the drift region 22a in the operation region 23a and in contact with the drift region 22a.

Next, referring to FIG. 8C, a well region 22 which has the first conductivity type is formed in the operation region 23a of the semiconductor layer 21', and the well region 22 is formed beneath the top surface 21a and in contact with the top surface 21a in the vertical direction. The well region 22 may be formed by, for example, implanting first conductivity type impurities in the form of accelerated ions by an ion implantation process step, as indicated by the dashed arrows in FIG. 8C, into the operation region 23a to form the well region 22.

Next, referring to FIG. 8D, a buffer region 25 which has the second conductivity type is formed in the well region 22 in the operation region 23a, and the buffer region 25 is located beneath the top surface 21a and in contact with the top surface 21a in the vertical direction. The buffer region 25 may be formed by, for example but not limited to, using a lithography process step to form a photoresist layer 25' as a mask, and implanting second conductivity type impurities into the well region 22 in the form of accelerated ions by an ion implantation process step, to form the buffer region 25.

Next, referring to FIG. 8E, the body region 26 which has the second conductivity type is formed in the well region 22 in the operation region 23a, and the body region 26 is located beneath the top surface 21a and in contact with the top surface 21a in the vertical direction. The body region 26 may be formed by, for example but not limited to, using a lithography process step to form a photoresist layer 263 as a mask, and doping second conductivity type impurities into the well region 22 by an ion implantation process step which implants the second conductivity type impurities into the well region 22 in the form of accelerated ions, to form the body region 26. The buffer region 25 encompasses all the periphery of the body regions 26 beneath the top surface 21a. The impurity concentration (second impurity concentration) of the second conductivity type impurities of the buffer region 25 is lower than the impurity concentration (first impurity concentration) of the second conductivity type impurities of the body regions 26.

Next, referring to FIG. 8F, a dielectric layer 271 and a conductive layer 272 of a gate 27 are formed on the top surface 21a in the operation region 23a. Viewing from the top view of FIG. 2A, the gate 27 is substantially a rectangle that extends along the width direction (as indicated by the direction of the solid arrow in FIG. 2A), and in the vertical direction (as indicated by the direction of the solid arrow in FIG. 8F), a portion of the body region 26 and a portion of the buffer region 25 are located beneath the gate 27 and in contact with the gate 27, to provide the inverse current channel during ON operation of the high voltage device 200.

Still referring to FIG. 8F, in one embodiment, after the dielectric layer 271 and the conductive layer 272 of the gate 27 are formed, a lightly doped region 281 is formed, to assist the portion of the body region 26 beneath the spacer layer 273 (to be formed later) to form the inverse current channel during ON operation of the high voltage device 200. The lightly doped region 281 may be formed by, for example, doping first conductivity type impurities into the body region 26 in the form of accelerated ions by an ion implantation process step, to form the lightly doped region 281.

Next, referring to FIG. 8G, a spacer layer 273 is formed outside of the conductive layer 272 to complete the gate 27. Next, referring to FIGS. 8H, 8I and 8J, wherein the FIGS. 8I and 8J respectively show a cross-section view according to the cross-section line AA' and a cross-section view according to the cross-section line BB' of FIG. 8H, a source 28 and a drain 29 which have the first conductivity type are formed beneath the top surface 21a and in contact with the top surface 21a in the operation region 23a in the vertical direction. The source 28 and the drain 29 are located outside and beneath the gate 27, and respectively at two lateral sides of the gate 27, wherein the source 28 is located in the body region 26 and the drain 29 is located in the well region 22 at a location which is away from the body region 26 in the channel direction. The drift region 22a is located between the drain 29 and the buffer region 25 in the channel direction, in the well region 22 and is near the top surface 21a, to serve as the drift current channel during ON operation of the high voltage device 200. The source 28 and the drain 29 are located beneath the top surface 21a and in contact with the top surface 21 in the vertical direction. The source 28 and the drain 29 may be formed by, for example but not limited to, using a lithography process step to form a photoresist layer 28' as a mask, and implanting first conductivity type impurities into the body region 26 and the well region 22 in the form of accelerated ions by an ion implantation process step, to form the source 28 and the drain 29. Note that, as shown in FIG. 8J according to the cross-section line BB' of FIG. 8H, the photoresist layer 28' must mask the region of the sub-body electrode 262' (to be formed later, see FIG. 2A), so that the ion implantation process step of forming the source 28 does not implant the first conductivity type impurities into the region which is designed to form the sub-body electrode 262'.

Next, please refer to FIGS. 8K, 8L and 8M, wherein FIGS. 8L and 8M respectively show a cross-section view according to the cross-section line AA' and a cross-section view according to the cross-section line BB' of FIG. 8K. As shown in FIGS. 8K, 8L and 8M, a body electrode 26' is formed in the body region 26. The body electrode 26' which has the second conductivity type serves as an electrical contact of the body region 26. The body electrode 26' is formed beneath the top surface 21a and in contact with the top surface 21a in the vertical direction. As shown by the top view at the lower part of FIG. 2A, the body electrode 26' includes a main body electrode 261' and at least one sub-body electrode 262'. From top view, the main body electrode 261' is adjacent to the source 28, and the main body electrode 261' and the source 28 are substantially rectangles that extend along the width direction, and the source 28 is located between the main body electrode 261' and the gate 27. The sub-body electrode 262' extends from a part of the main body electrode 261' toward the gate 27 in the channel direction and is in contact with the inverse current channel. The body electrode 26' may be formed by, for example but not limited to, using a lithography process step to form a photoresist layer 26" as a mask, and implanting second conductivity type impurities into the body region 26 in the form of accelerated ions by an ion implantation process step, to form the body electrode 26'.

Next, referring to FIGS. 8N and 8O, wherein FIG. 8O shows a cross-section view according to the cross-section line AA' of FIG. 8N, the photoresist layer 26" is removed to form the high voltage device 200.

Figure 9A:
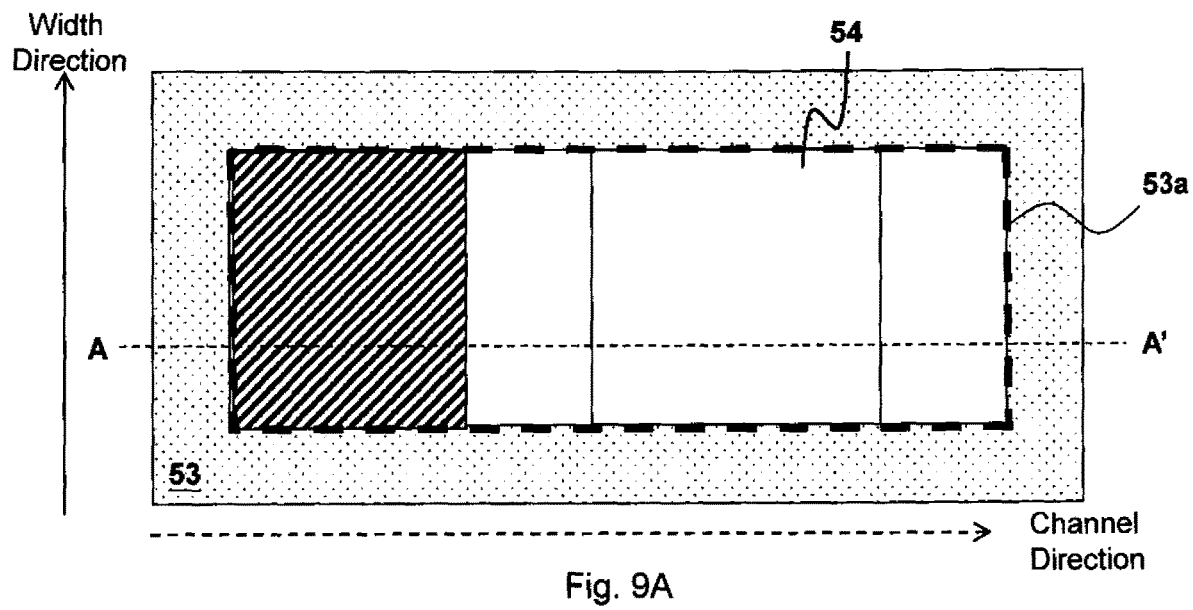
FIGS. 9A to 9L show an eighth embodiment of the present invention.
Figure 9B:
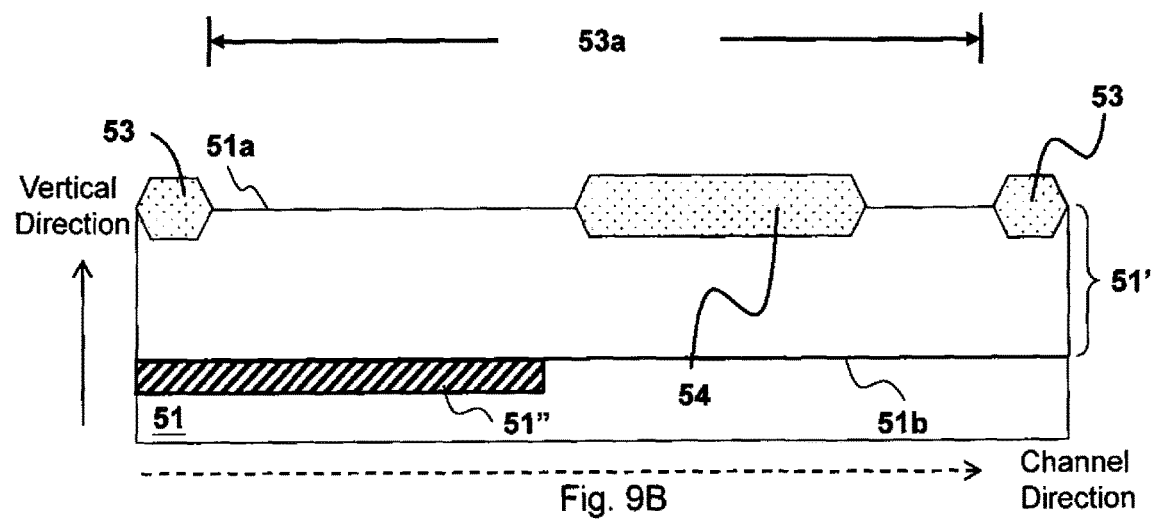

Please refer to FIGS. 9A to 9L, which show an eighth embodiment of the present invention. FIGS. 9A to 9L show top views and cross-section views of a manufacturing method of the high voltage device 500. As shown in FIGS. 9A and 9B, first, a semiconductor layer 51' is formed on a substrate 51; the semiconductor layer 51' has a top surface 51a and a bottom surface 51b that is opposite to the top surface 51a in a vertical direction (as indicated by the direction of the solid arrow in FIG. 9B). The substrate 51 is, for example but not limited to, a P-type or N-type semiconductor silicon substrate. The semiconductor layer 51' is formed on the substrate 51, for example, by epitaxy, or a part of the substrate 51 forms the semiconductor layer 51'. The method of forming the semiconductor layer 51' is known to a person having ordinary skill in the art, so the details thereof are not redundantly explained here.

Still referring to FIGS. 9A and 9B, an isolation structure 53 is formed on the top surface 51a and in contact with the top surface 21a for defining an operation region 53a. The isolation structure 53 is not limited to the local oxidation of silicon (LOCOS) structure as shown in the figures, and may be a shallow trench isolation (STI) structure instead. In one embodiment, by the same process steps and at the same time of forming the isolation structure 53, a drift oxide region 54 is formed on the top surface 51a and in contact with the top surface 51a. The drift oxide region 54 is located on the drift region 52a in the operation region 53a (as indicated by the dashed line frame in FIG. 9A) and in contact with the drift region 52a.

Next, referring to FIGS. 9A to 9B in conjunction with FIGS. 5A-5C, a buried layer 51" is formed. The desired location of the buried layer 51" is beneath a channel well region 56 (to be formed later); the buried layer 51" will be in contact with the channel well region 56, and will completely cover the portion of the channel well region 56 in the operation region 53a. In the vertical direction, in one embodiment, the buried layer 51" is formed on both sides of the junction between the substrate 51 and the semiconductor layer 51', i.e., a portion of the buried layer 51" is located in the substrate 51, and a portion of the buried layer 51" is located in the semiconductor layer 51'. The buried layer 51" has the first conductivity type, and may be formed for example by implanting first conductivity type impurities into the substrate 51 in the form of accelerated ions by an ion implantation process step.

Figure 9C:
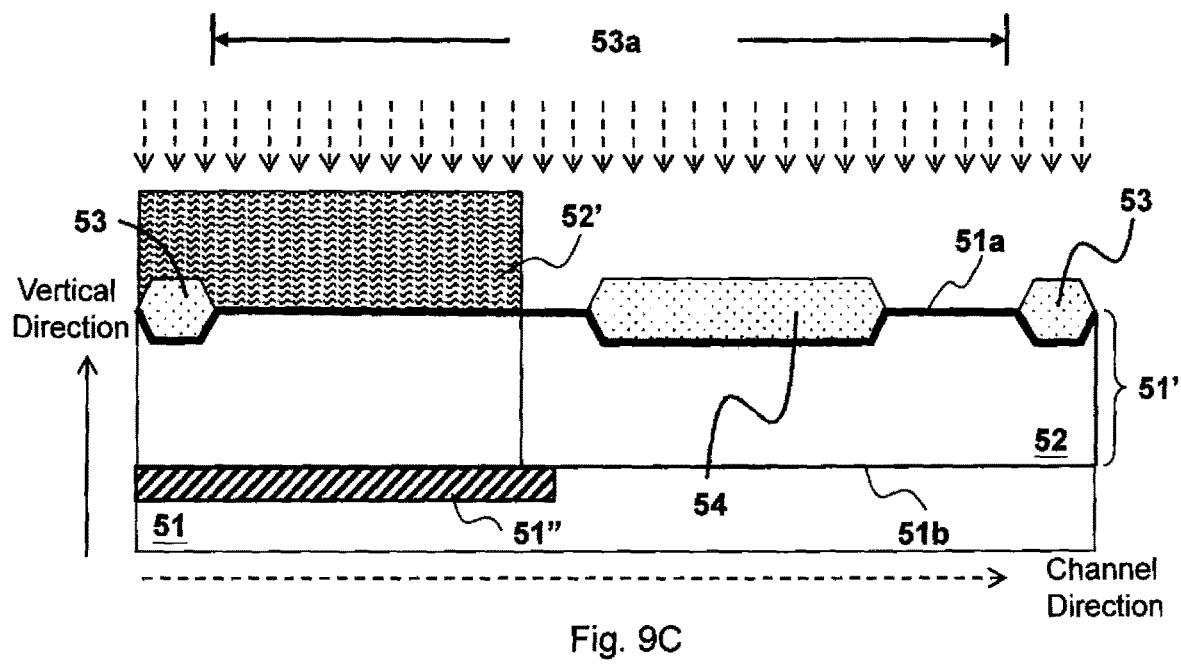

Next, referring to FIG. 9C, a drift well region 52 which has the first conductivity type is formed in the operation region 53a of the semiconductor layer 51', and the drift well region 52 is located beneath the top surface 51a and in contact with the top surface 51a in the vertical direction (the top surface 51a now is as shown by the thick line in the figure). The drift well region 52 may be formed for example by using a lithography process step to form a photoresist layer 52' as a mask, and implanting first conductivity type impurities to the semiconductor layer 51' in the form of accelerated ions by an ion implantation process step, to form drift well region 52.

Figure 9D:
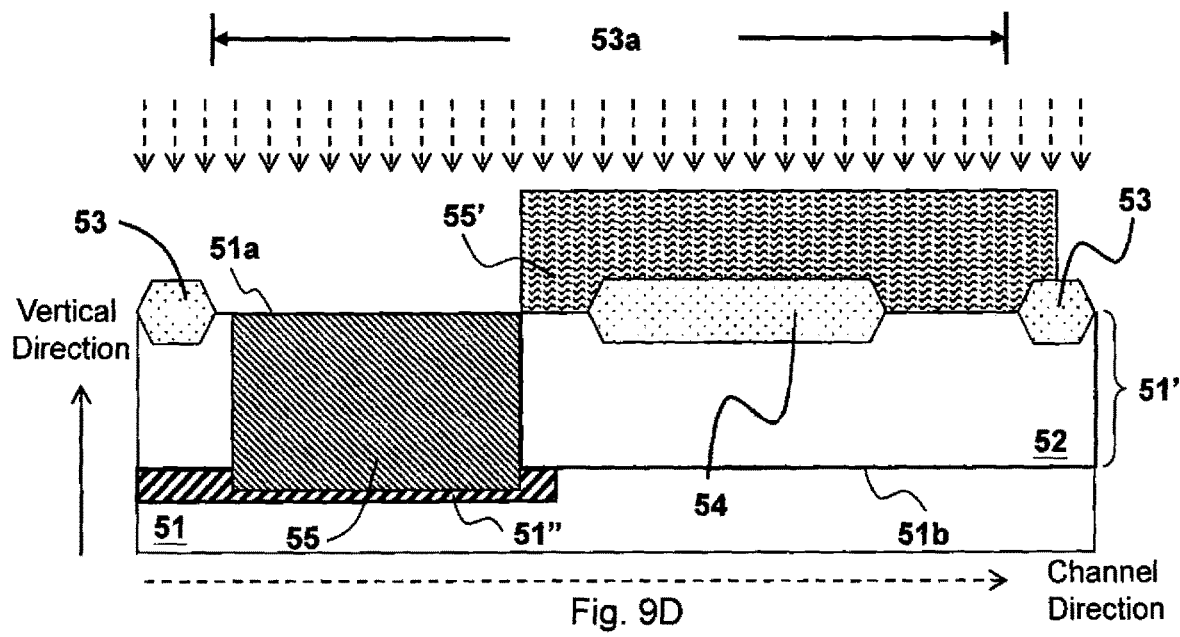

Next, referring to FIG. 9D, a buffer region 52 which has the second conductivity type is formed in the operation region 53a, and the buffer region 52 is located beneath the top surface 51a and in contact with the top surface 51a in the vertical direction. The buffer region 52 is in contact with the drift well region 55 in the channel direction (as indicated by the direction of the dashed arrow in FIG. 9D). The buffer region 55 may be formed by, for example but not limited to, using a lithography process step to form a photoresist layer 55' as a mask, and implanting second conductivity type impurities into the semiconductor layer 51' in the form of accelerated ions by an ion implantation process step, to form the buffer region 55.

Figure 9E:
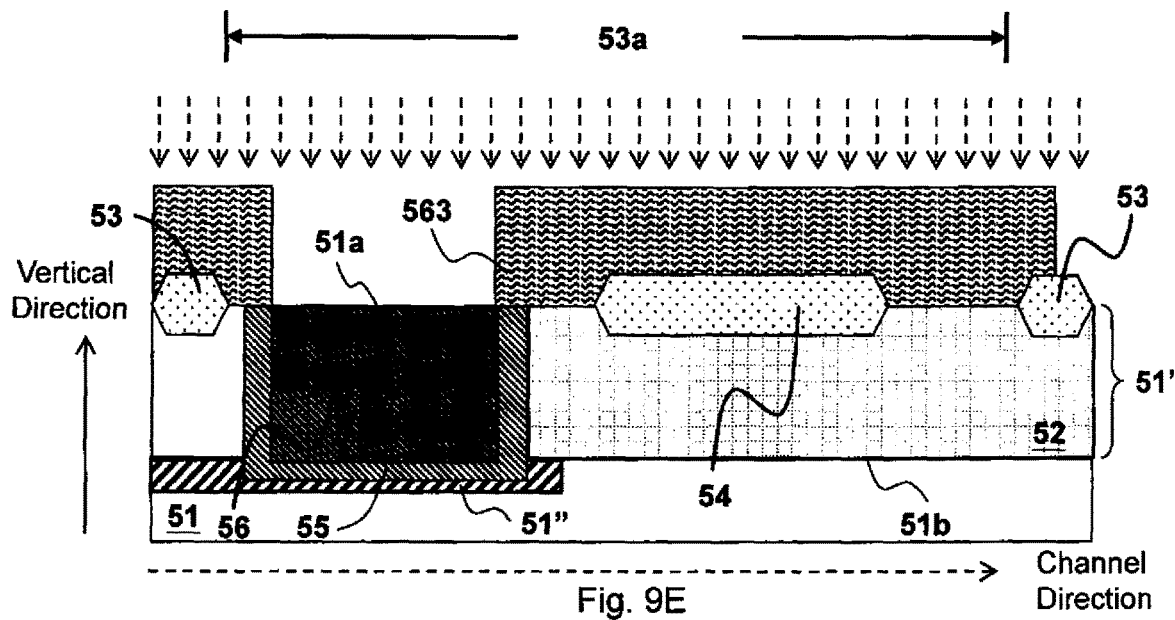

Next, referring to FIG. 9E, the channel well region 56 which has the second conductivity type is formed in the operation region 53a, and the channel well region 56 is located beneath the top surface 51a and in contact with the top surface 51a in the vertical direction. The channel well region 56 may be formed by, for example but not limited to, using a lithography process step to form a photoresist layer 563 as a mask, and implanting second conductivity type impurities into the semiconductor layer 51' in the form of accelerated ions by an ion implantation process step, to form the channel well region 56.

Figure 9F:
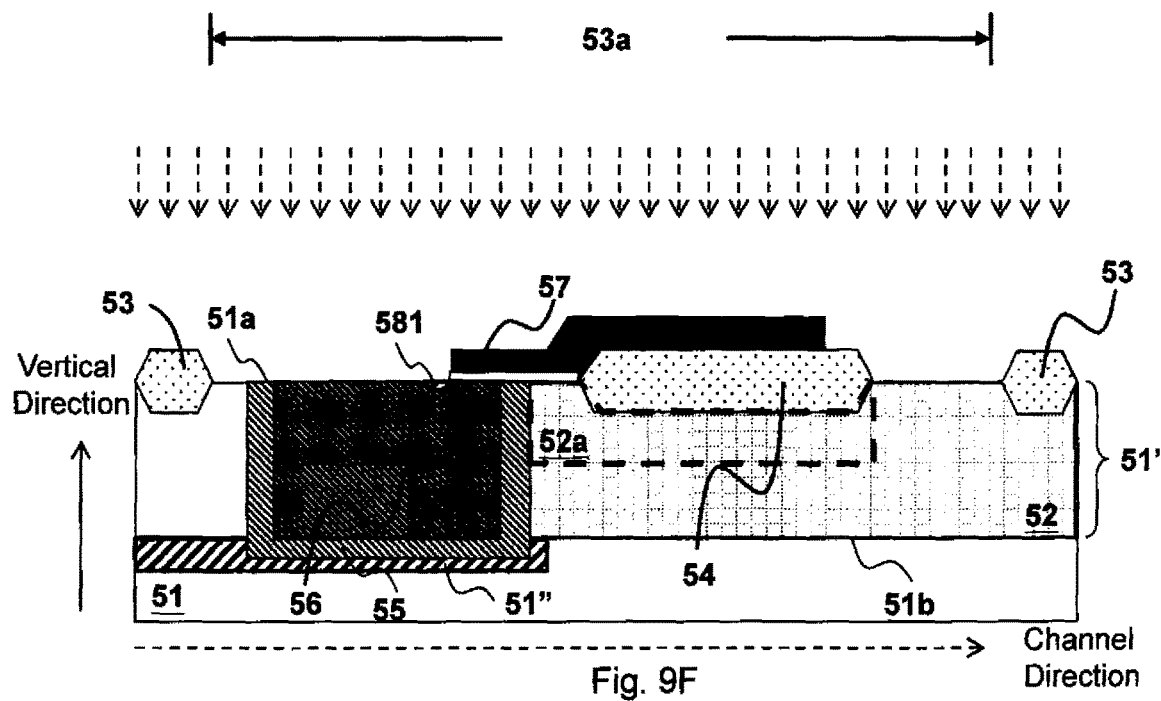

Next, referring to FIG. 9F, a dielectric layer and a conductive layer of a gate 57 are formed on the top surface 51a in the operation region 53a. From top view, the gate 57 is substantially a rectangle that extends along the width direction, and in the vertical direction, a portion of the channel well region 56 and a portion of the buffer region 55 are located beneath the gate 57 and in contact with the gate 57 to provide the inverse current channel during ON operation of the high voltage device 500.

Still referring to FIG. 9F, in one embodiment, after the dielectric layer and the conductive layer of the gate 57 are formed, a lightly doped region 581 is formed to assist the portion of the channel well region 56 beneath the spacer layer (to be formed later) to form the inverse current channel during ON operation of the high voltage device 500. The lightly doped region 581 may be formed by, for example, doping first conductivity type impurities into the channel well region 56 in the form of accelerated ions by an ion implantation process step, to form the lightly doped region 581.

Figure 9G:
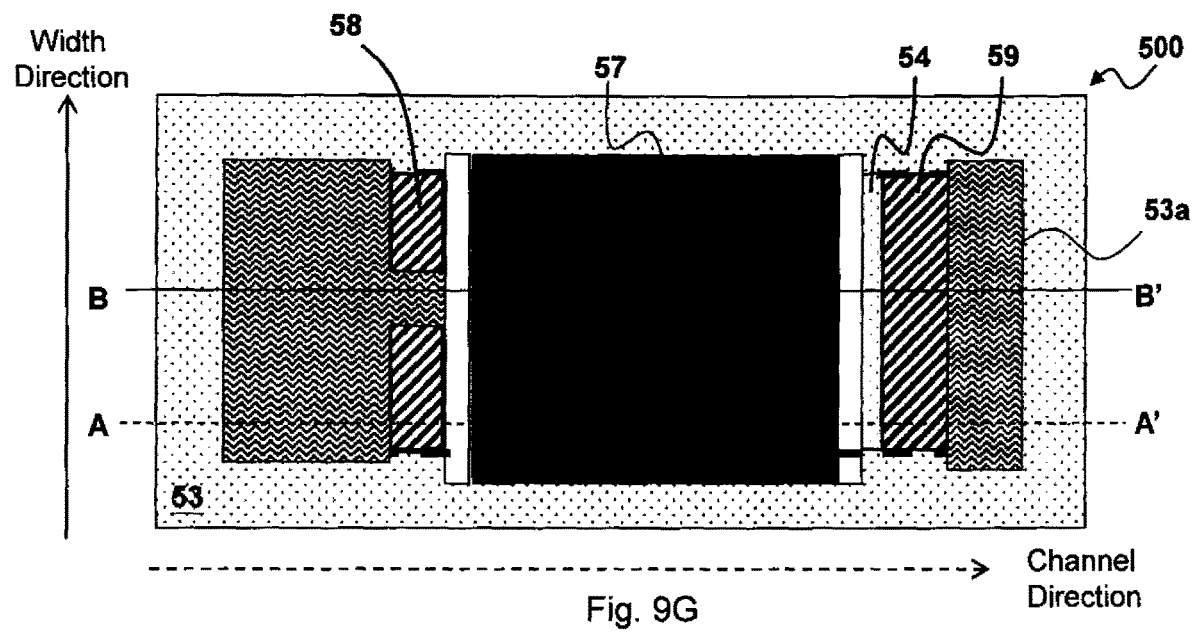
Figure 9H:
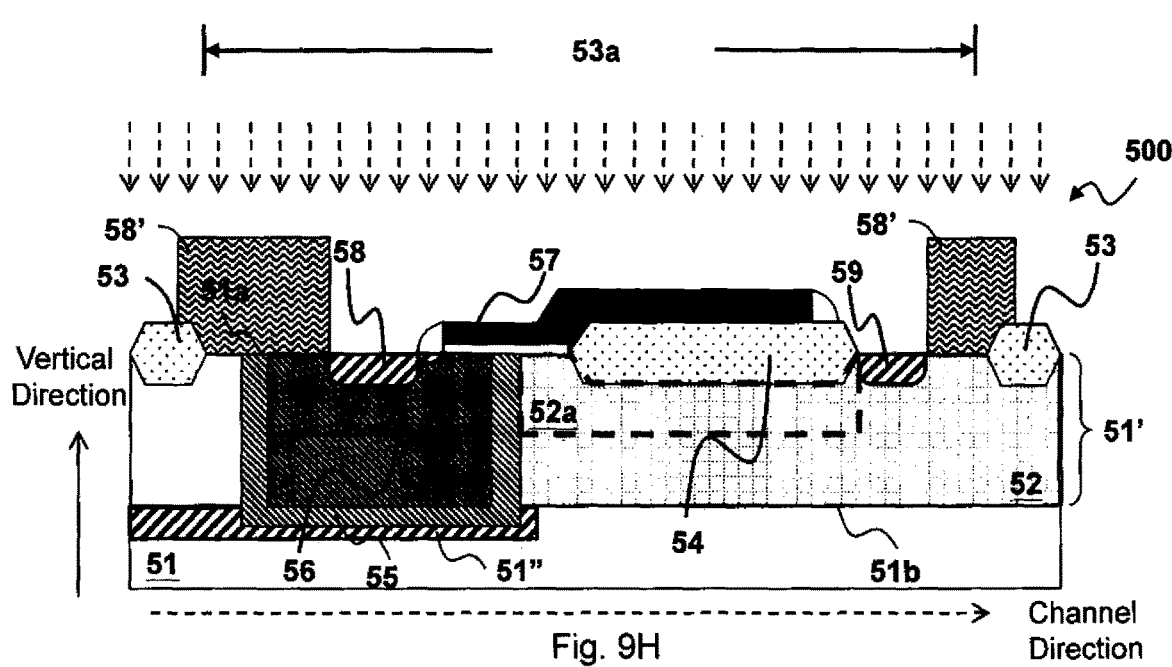
Figure 9I:
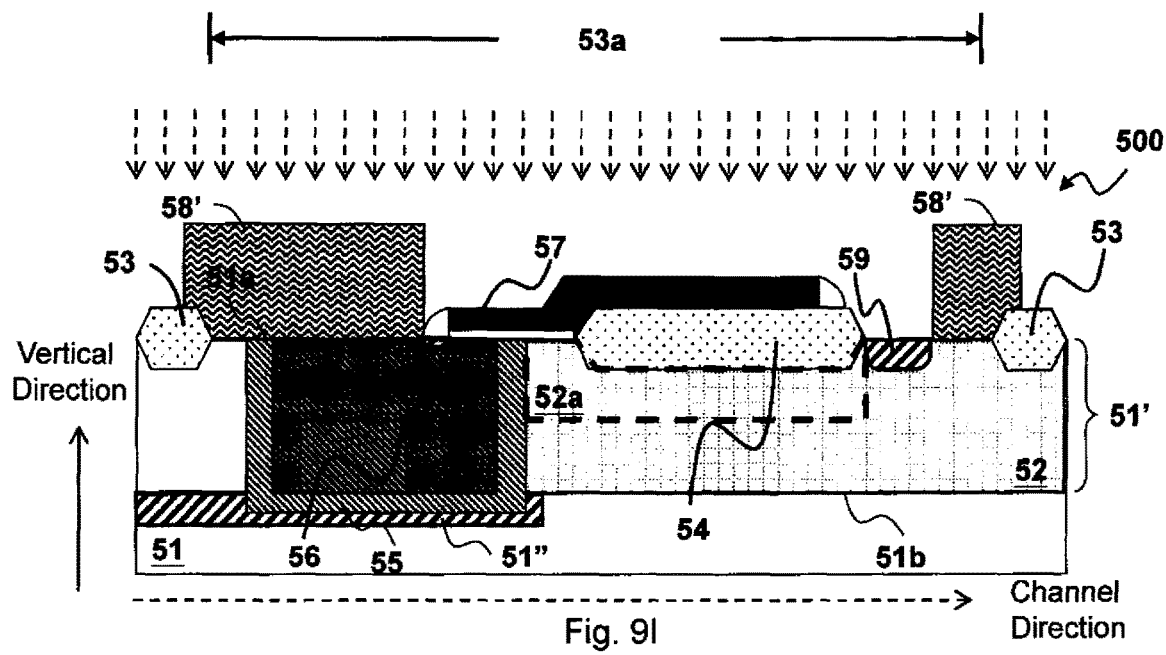

Next, referring to FIG. 9G to 9I, wherein FIGS. 9H and 9I respectively show cross-section views according to the cross-section line AA' and the cross-section line BB' of FIG. 9G, a spacer layer is formed outside the conductive layer, to complete the gate 57. Next, a source 58 and a drain 59 both having the first conductivity type are formed; the source 58 and the drain 59 are formed in the operation region 53a, beneath the top surface 51a and in contact with the top surface 51a in the vertical direction; the source 58 and the drain 59 are located outside and beneath the gate 57, and respectively at two lateral sides of the gate 57, wherein the source 58 is located in the channel well region 56 and the drain 59 is located in the drift well region 52 at a location which is away from the channel well region 56 in the channel direction. The drift region 52a is located between the drain 59 and the buffer region 55 in the channel direction, in the well region 52 and is near the top surface 51a, to serve as the drift current channel during ON operation of the high voltage device 500. The source 58 and the drain 59 are located beneath the top surface 51a and in contact with the top surface 51 in the vertical direction. The source 58 and the drain 59 which have the first conductivity type may be formed by, for example but not limited to, forming a photoresist layer 58' as a mask by a lithography process step, and doping first conductivity type impurities into the channel well region 56 and the drift well region 52 respectively, in the form of accelerated ions by an ion implantation process step, to form the source 58 and the drain 59. Note that the photoresist layer 58' should preferably mask the sub-body electrode region so that the ion implantation process step for forming the source 58 does not implant the first conductivity type impurities into the region which is designed to form the sub-body electrode, as shown by FIG. 9I which is the cross-section view according to the cross-section line BB' of FIG. 9G.

Figure 9J:
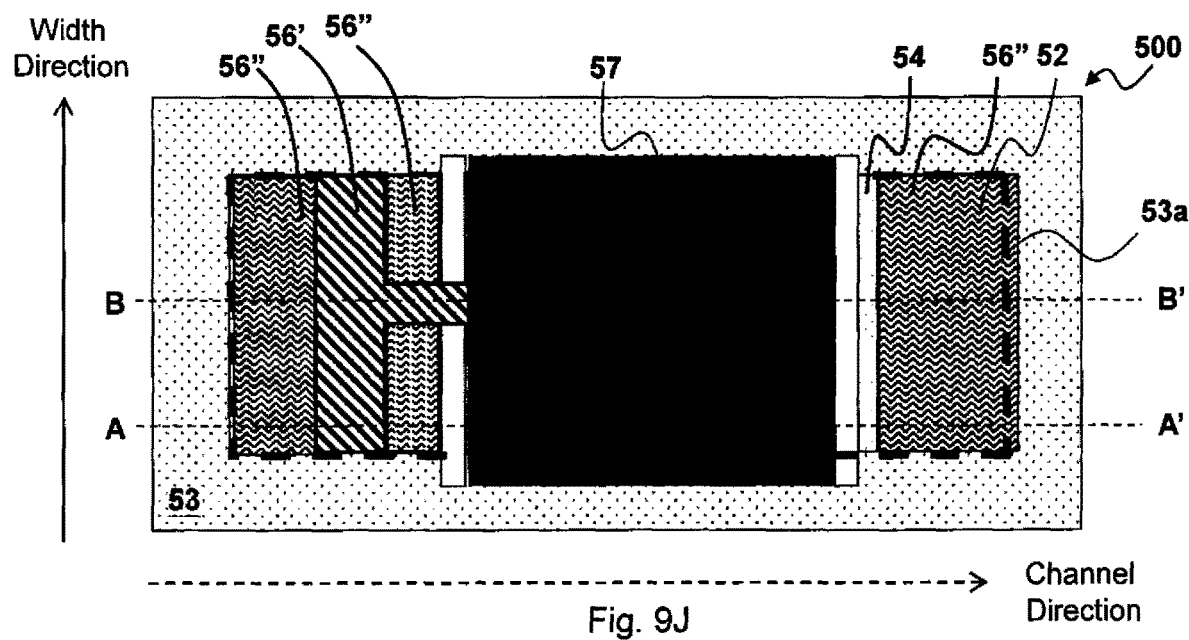
Figure 9K:
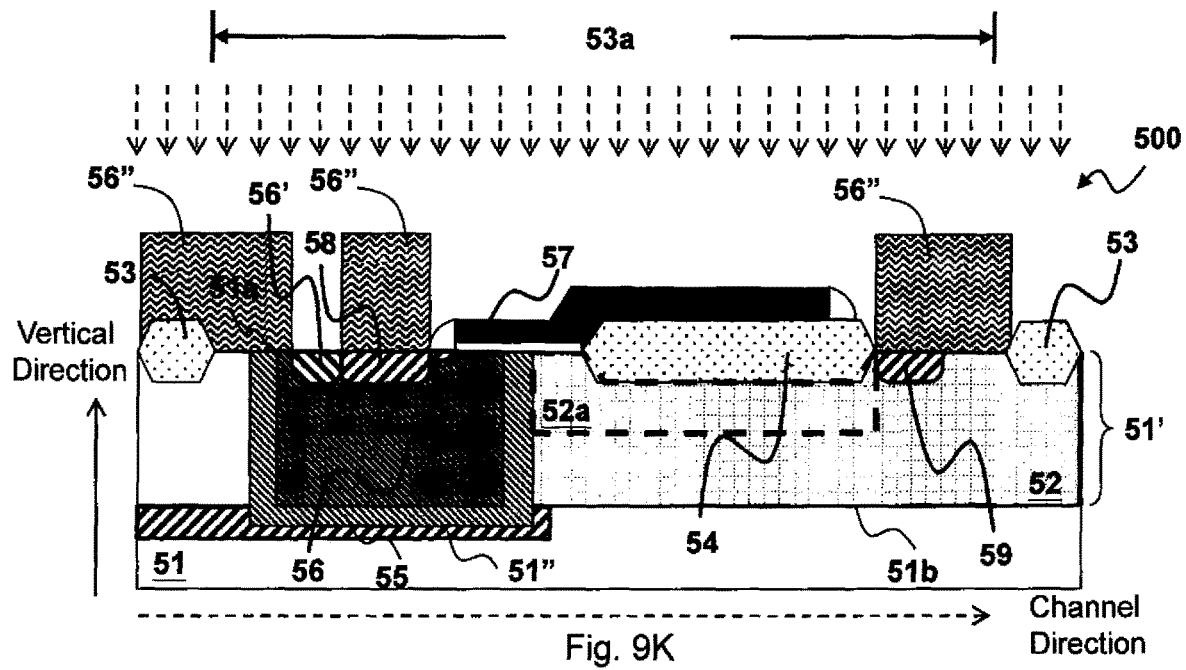
Figure 9L:
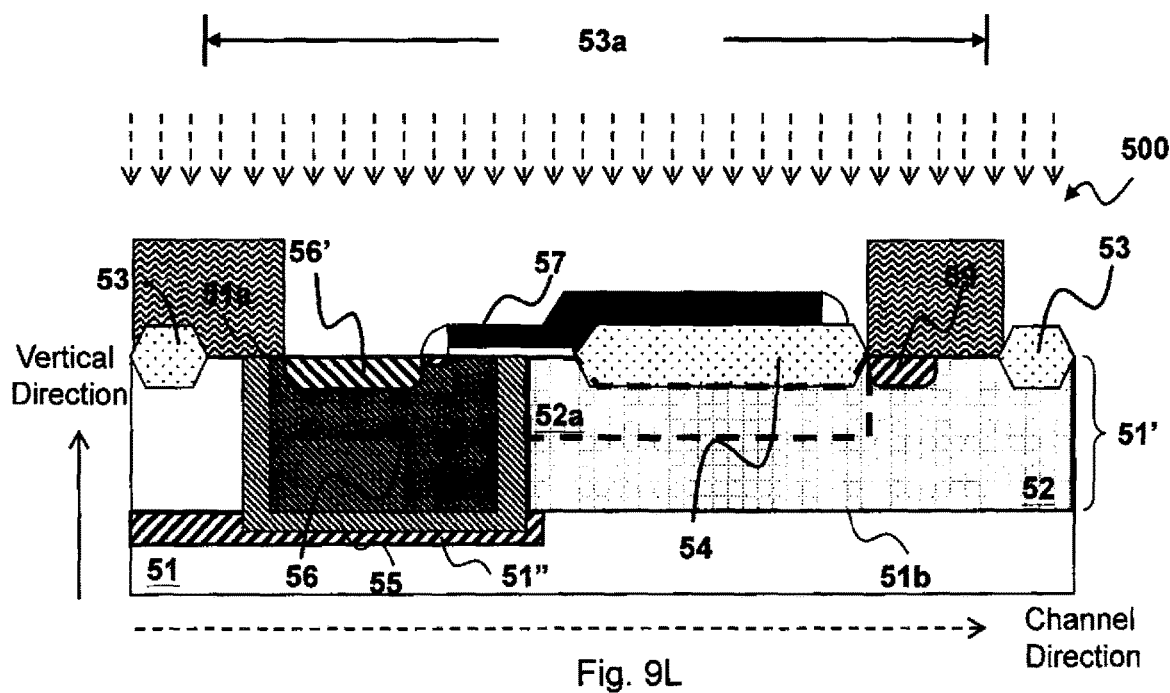

Next, referring to FIGS. 9J, 9K and 9L, wherein FIGS. 9K and 9I respectively show cross-section views according to the cross-section line AA' and the cross-section line BB' of FIG. 9J. As shown in FIGS. 9J, 9K and 9L, a channel well region contact 56' is formed in the channel well region 56. The channel well region contact 56' which has the second conductivity type serves as an electrical contact of the channel well region 56. The channel well region contact 56' is formed beneath the top surface 51a and in contact with the top surface 51a in the vertical direction. Similar to the top view at the lower part of FIG. 2A, the channel well region contact 56' includes a main channel well region contact and at least one sub-channel well region contact. From top view, the main channel well region contact is adjacent to the source 58, and the main channel well region contact and the source 58 are substantially rectangles that extend along the width direction, wherein the source 58 is located between the main channel well region contact and the gate 57. The sub-channel well region contact extends from a part of the main channel well region contact toward the gate 57 in the channel direction, and is in contact with the inverse current channel. The channel well contact 56' may be formed by, for example but not limited to, forming a photoresist layer 56" as a mask by a lithography process step, and implanting second conductivity type impurities into the channel well region 56 in the form of accelerated ions by an ion implantation process step, to form the channel well contact 56'.

Figure 10A:
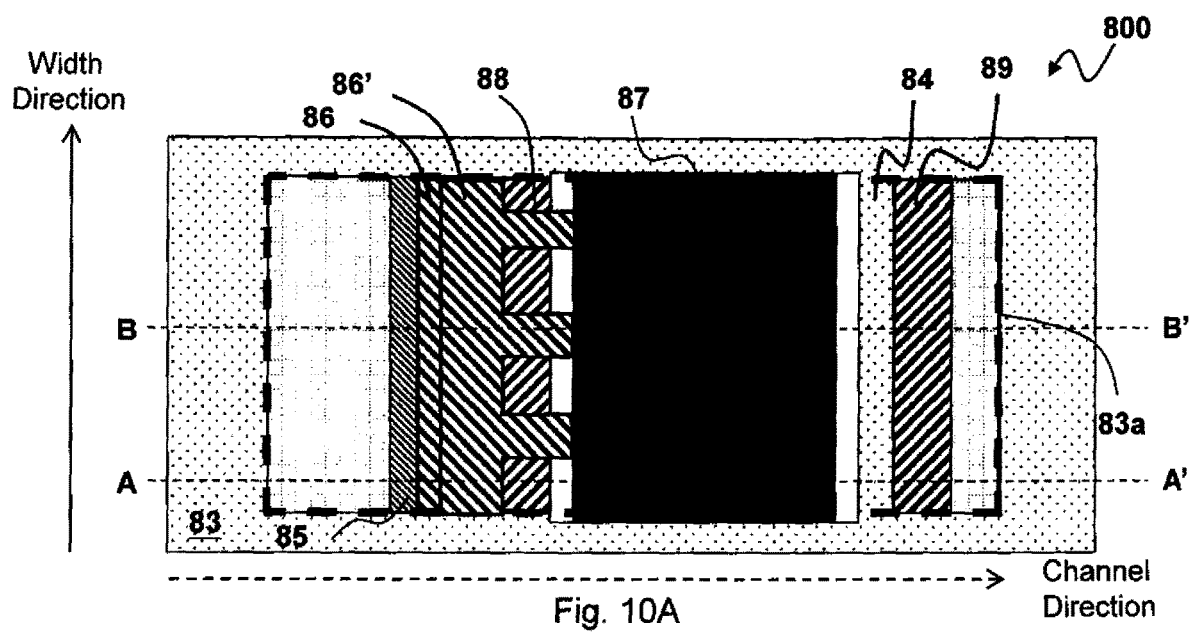
FIGS. 10A to 10C show a ninth embodiment of the present invention.
Figure 10B:
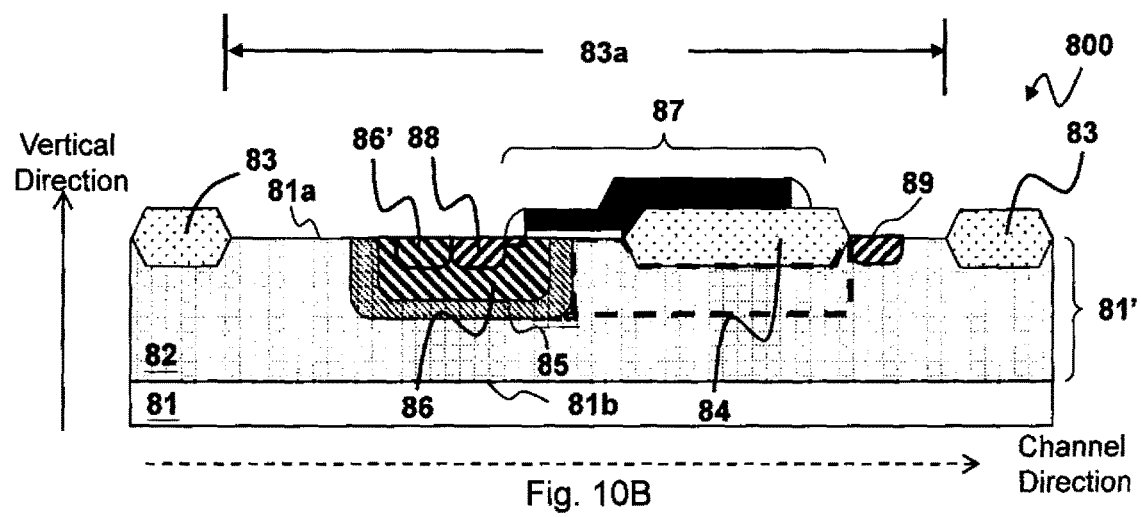
Figure 10C:
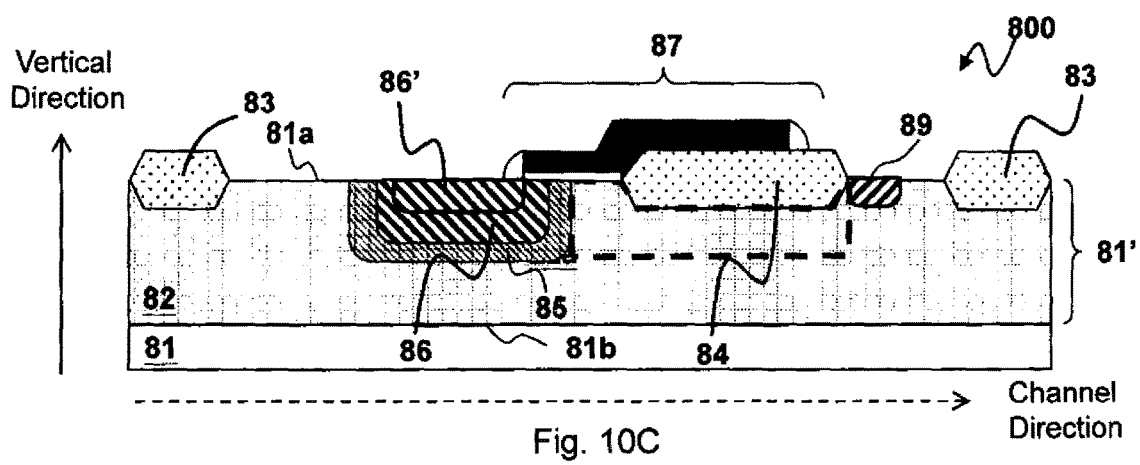

Please refer to FIGS. 10A to 10C, which show a ninth embodiment of the present invention. FIGS. 10A, 10B and 10C respectively show a top view, a cross-section view according to the cross-section line AA' and a cross-section view according to the cross-section line BB' of a high voltage device 800. As show in FIGS. 10A to 10C, the high voltage device 800 includes a semiconductor layer 81', a well region 82, an isolation structure 83, a drift oxide region 84, a buffer region 85, a body region 86, a body electrode 86', a gate 87, a source 88, and a drain 89. The semiconductor layer 81' which is formed on the substrate 81 has a top surface 81a and a bottom surface 81b that is opposite to the top surface 81a in the vertical direction (as indicated by the direction of the solid arrow in FIGS. 10B and 10C). The substrate 81 is, for example but not limited to, a P-type or N-type semiconductor silicon substrate. The semiconductor layer 81', for example, is formed on the substrate 81 by epitaxy, or a part of the substrate 81 forms the semiconductor layer 81'. The method of forming the semiconductor layer 81' is known to a person having ordinary skill in the art, so the details thereof are not redundantly explained here.

Still referring to FIGS. 10A to 10C, the isolation structure 83 is formed on the top surface 81a and in contact with the top surface 81a, for defining an operation region 83a (as indicated by the dashed line frame in FIG. 10A). The isolation structure 83 is not limited to the local oxidation of silicon (LOCOS) structure as shown in FIGS. 10B and 10C, and may be a shallow trench isolation (STI) structure instead. The drift oxide region 84 is formed on the top surface 81a and in contact with the top surface 81a, and is located on the drift region 82a in the operation region 83a and in contact with the drift region 82a (as indicated by the dashed line frame in FIGS. 10B and 10C).

The well region 82 which has the first conductivity type is formed in the operation region 83a of the semiconductor layer 81', and the well region 82 is located beneath the top surface 81a and in contact with the top surface 81a in the vertical direction. The body region 86 which has the second conductivity type is formed in the well region 82 in the operation region 83a; the body region 86 is located beneath the top surface 81a and in contact with the top surface 81a in the vertical direction, and the body region 86 has a first impurity concentration of the second conductivity type impurities. The body electrode 86' which has the second conductivity type serves as an electrical contact of the body region 86. The body electrode 86' is formed in the body region 86, beneath the top surface 31a and in contact with the top surface 81a in the vertical direction. Referring to the top view at the lower part of FIG. 10A, the body electrode 86' includes a main body electrode and at least one sub-body electrode. From top view, the main body electrode is adjacent to the source 88 and the main body electrode and the source 88 are substantially rectangles that extend along the width direction (as indicated by the direction of the solid arrow in FIG. 10A), wherein the source 88 is located between the main body electrode and the gate 87. The sub-body electrode extends from a part of the main body electrode toward the gate 87 in the channel direction (as indicated by the direction of the dashed arrow in FIGS. 10A to 10C), and is in contact with the inverse current channel. The buffer region 85 which has the second conductivity type is formed in the well region 82 in the operation region 82a, and the buffer region 85 is located beneath the top surface 81a and in contact with the top surface 81a in the vertical direction; the buffer region 85 covers encompasses all the periphery of the body region 86 below the top surface 81a of the semiconductor layer 81', and the buffer region 85 has a second impurity concentration of the second conductivity type impurities which is lower than the first impurity concentration. The gate 87 is formed on the top surface 81a in the operation region 83a. From top view, the gate 87 is substantially a rectangle that extends along the width direction, and in the vertical direction, a portion of the body region 86 and a portion of the buffer region 85 are located beneath the gate 87 and in contact with the gate 87, to assist forming the inverse current channel during ON operation of the high voltage device 800.

Still referring to FIGS. 10A to 10C, the source 88 and the drain 89 which have the first conductivity type are formed in the operation region 83a, beneath the top surface 81a and in contact with the top surface 81a in the vertical direction. The source 88 and the drain 89 are located outside and beneath the gate 87, and respectively at two lateral sides of the gate 87, wherein the source 88 is located in the body region 86 and the drain 89 is located in the drift well region 82 at a location which is away from the body region 86 in the channel direction. The drift region 82a is located between the drain 89 and the buffer region 85 in the channel direction, in the well region 82 and is near the top surface 81a, to serve as the drift current channel during ON operation of the high voltage device 800. The source 88 and the drain 89 are located beneath the top surface 81a and in contact with the top surface 81 in the vertical direction.

This embodiment differs from the first embodiment in that: the body electrode 86' of this embodiment includes plural sub-body electrodes, wherein the sub-body electrodes are arranged in parallel in the width direction, and are not in contact with each other; and, the source 88 is divided into plural regions that are arranged in parallel in the width direction and are not in contact with each other.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. The various embodiments described above are not limited to being used alone; two embodiments may be used in combination, or a part of one embodiment may be used in another embodiment. For example, other process steps or structures, such as a deep well region, may be added. For another example, the lithography technique is not limited to the mask technology but it can be electron beam lithography, immersion lithography, etc. Therefore, in the same spirit of the present invention, those skilled in the art can think of various equivalent variations and modifications, which should fall in the scope of the claims and the equivalents.

What is claimed is:

1. A high voltage device comprising:
   a semiconductor layer formed on a substrate, wherein the semiconductor layer has a top surface and a bottom surface that is opposite to the top surface in a vertical direction;
   an isolation structure formed on and in contact with the top surface, wherein the isolation structure defines an operation region;
   a drift oxide region formed on and in contact with the top surface, wherein the drift oxide region is located on a drift region in the operation region and in contact with the drift region;
   a well region having a first conductivity type, wherein the well region is formed in the operation region, and the well region is formed beneath the top surface and in contact with the top surface in the vertical direction;
   a body region having a second conductivity type, wherein the body region is formed in the well region in the operation region and is located beneath the top surface and in contact with the top surface in the vertical direction, and the body region has a first impurity concentration;
   a body electrode having the second conductivity type, the body electrode serving as an electrical contact of the body region, wherein the body electrode is formed in the body region, beneath the top surface and in contact with the top surface, and the body electrode includes a main body electrode and at least one sub-body electrode;
   a buffer region having the second conductivity type, wherein the buffer region is formed in the well region in the operation region, beneath the top surface and in contact with the top surface in the vertical direction, and the buffer region encompasses all periphery of the body region below the top surface, wherein the buffer region has a second impurity concentration which is lower than the first impurity concentration;
   a gate formed on the top surface in the operation region, wherein the gate is substantially a rectangle that extends along a width direction which is a direction perpendicular to the vertical direction, and a portion of the body region and the buffer region are located right below the gate and in contact with the gate to assist forming an inverse current channel during ON operation of the high voltage device; and
   a source and a drain having the first conductivity type, wherein the source and the drain are formed in the operation region, beneath the top surface and in contact with the top surface in the vertical direction, and the source and the drain are located outside and beneath the gate, and respectively at two lateral sides of the gate, wherein the source is located in the body region and the drain is located in the well region at a location which is away from the body region;
   wherein the drift region is located in the well region, between the drain and the buffer region in a channel direction which is a direction perpendicular to the vertical direction and the width direction, and is in contact with the top surface, to serve as a drift current channel during ON operation of the high voltage device;
   wherein the main body electrode is adjacent to the source, and the main body electrode and the source are substantially rectangles that extend along the width direction, wherein the source is located between the main body electrode and the gate, and the sub-body electrode extends from the main body electrode toward the gate in the channel direction and contacts the inverse current channel.

2. The high voltage device of claim 1, wherein the drift oxide region includes a local oxidation of silicon (LOCOS) structure, a shallow trench isolation (STI) or a chemical vapor deposition (CVD) oxide structure.

3. The high voltage device of claim 1, wherein the body electrode includes a plurality of sub-body electrodes which are not in contact with each other.

4. The high voltage device of claim 1, wherein the source, the body region, the buffer region, and the well region form a parasitic transistor, and the sub-body electrode provides a hot carrier absorption channel to suppress a possibility of turning ON the parasitic transistor.

5. The high voltage device of claim 1, wherein the buffer region is for reducing the capacitance between the body region and the well region during a transient state operation of the high voltage device.

6. A manufacturing method of a high voltage device, comprising:
   forming a semiconductor layer formed on a substrate, wherein the semiconductor layer has a top surface and a bottom surface that is opposite to the top surface in a vertical direction;
   forming an isolation structure on and in contact with the top surface, wherein the isolation structure defines an operation region;
   forming a drift oxide region on and in contact with the top surface, wherein the drift oxide region is located on a drift region in the operation region and in contact with the drift region;
   forming a well region in the operation region, wherein the well region is formed beneath the top surface and in contact with the top surface in the vertical direction, and the well region has a first conductivity type;
   forming a body region having a second conductivity type in the well region in the operation region, wherein the body region is located beneath the top surface and in contact with the top surface in the vertical direction, and the body region has a first impurity concentration;
   forming a body electrode having the second conductivity type in the body region to serve as an electrical contact of the body region, wherein the body electrode is located beneath the top surface and in contact with the top surface in the vertical direction, and the body electrode includes a main body electrode and at least one sub-body electrode;

forming a buffer region having the second conductivity type in the well region in the operation region, beneath the top surface and in contact with the top surface in the vertical direction, wherein the buffer region encompasses all periphery of the body region below the top surface, and wherein the buffer region has a second impurity concentration which is lower than the first impurity concentration;

forming a gate on the top surface in the operation region, wherein the gate is substantially a rectangle that extends along a width direction which is a direction perpendicular to the vertical direction, and a portion of the body region and the buffer region are located right below the gate and in contact with the gate to assist forming an inverse current channel during ON operation of the high voltage device;

forming a source and a drain having the first conductivity type, wherein the source and the drain are formed in the operation region, beneath the top surface and in contact with the top surface in the vertical direction, and the source and the drain are located outside and beneath the gate, and respectively at two lateral sides of the gate, wherein the source is located in the body region and the drain is located in the well region at a location which is away from the body region;

wherein the drift region is located in the well region, between the drain and the buffer region in a channel direction which is a direction perpendicular to the vertical direction and the width direction, and is in contact with the top surface, to serve as a drift current channel during ON operation of the high voltage device;

wherein the main body electrode is adjacent to the source, and the main body electrode and the source are substantially rectangles that extend along the width direction, wherein the source is located between the main body electrode and the gate, and the sub-body electrode extends from the main body electrode toward the gate in the channel direction and contacts the inverse current channel.

7. The manufacturing method of the high voltage device of claim 6, wherein the drift oxide region includes a local oxidation of silicon (LOCOS) structure, a shallow trench isolation (STI) or a chemical vapor deposition (CVD) oxide structure.

8. The manufacturing method of the high voltage device of claim 6, wherein the body electrode includes a plurality of sub-body electrodes which are not in contact with each other.

9. The manufacturing method of the high voltage device of claim 6, wherein the source, the body region, the buffer region, and the well region form a parasitic transistor, and the sub-body electrode provides a hot carrier absorption channel to suppress a possibility of turning ON the parasitic transistor.

10. The manufacturing method of the high voltage device of claim 6, wherein the buffer region is for reducing the capacitance between the body region and the well region during a transient state operation of the high voltage device.

11. A high voltage device comprising:
a semiconductor layer formed on a substrate, wherein the semiconductor layer has a top surface and a bottom surface that is opposite to the top surface in a vertical direction;
an isolation structure formed on and in contact with the top surface, wherein the isolation structure defines an operation region;
a drift oxide region formed on and in contact with the top surface, wherein the drift oxide region is located on a drift region in the operation region and in contact with the drift region;
a drift well region having a first conductivity type, wherein the drift well region is formed in the operation region of the semiconductor layer and the drift well region is formed beneath the top surface and in contact with the top surface in the vertical direction;
a channel well region having a second conductivity type, wherein the channel well region is formed in the operation region and is located beneath the top surface and in contact with the top surface, and the channel well region has a first impurity concentration;
a channel well region contact having the second conductivity type, the channel well region contact serving as an electrical contact of the channel well region, wherein the channel well region contact is formed in the channel well region, beneath the top surface and in contact with the top surface in the vertical direction, and the channel well region contact includes a main channel well region contact and at least one sub-channel well region contact;
a buffer region having the second conductivity type in the operation region, wherein the buffer region is formed beneath the top surface and in contact with the top surface in the vertical direction, and the buffer region encompasses all periphery of the channel well region below the top surface of the semiconductor layer, and the buffer region is in contact with the drift well region in a channel direction which is a direction perpendicular to the vertical direction, wherein the buffer region has a second impurity concentration which is lower than the first impurity concentration;
a buried layer having the first conductivity type, wherein the buried layer is formed beneath the channel well region and in contact with the channel well region in the vertical direction, and the buried layer completely covers a portion of the channel well region which is in the operation region;
a gate formed on the top surface in the operation region, wherein the gate is substantially a rectangle that extends along a width direction which is a direction perpendicular to the vertical direction and the channel direction, and a portion of the body region and the buffer region are located right below the gate and in contact with the gate to assist forming an inverse current channel during ON operation of the high voltage device; and
a source and a drain having the first conductivity type, wherein the source and the drain are formed in the operation region, beneath the top surface and in contact with the top surface in the vertical direction, and the source and the drain are located outside and beneath the gate, and respectively at two lateral sides of the gate, wherein the source is located in the channel well region and the drain is located in the drift well region at a location which is away from the channel well region;
wherein the drift region is located in the drift well region, between the drain and the buffer region in the channel direction, and is in contact with the top surface, to serve as a drift current channel during ON operation of the high voltage device;

wherein the main channel well region contact is adjacent to the source, and the main channel well region contact and the source substantially are rectangles that extend along the width direction, wherein the source is located between the main channel well region contact and the gate, and the sub-channel well region contact extends from the main channel well region contact toward the gate in the channel direction and contacts the inverse current channel.

12. The high voltage device of claim 11, wherein the drift oxide region includes a local oxidation of silicon (LOCOS) structure, a shallow trench isolation (STI) or a chemical vapor deposition (CVD) oxide structure.

13. The high voltage device of claim 11, wherein the channel well region contact includes a plurality of sub-channel well region contacts which are not in contact with each other.

14. The high voltage device of claim 11, wherein the source, the body region, the buffer region and the drift well region form a parasitic transistor, and the sub-channel well region contact provides a hot carrier absorption channel to suppress a possibility of turning ON the parasitic transistor.

15. The high voltage device of claim 11, wherein the buffer region is for reducing the capacitance between the channel well region and the drift well region during a transient state operation of the high voltage device.

16. A manufacturing method of a high voltage device, comprising:

forming a semiconductor layer on a substrate, wherein the semiconductor layer has a top surface and a bottom surface that is opposite to the top surface in a vertical direction;

forming an isolation structure on and in contact with the top surface, wherein the isolation structure defines an operation region;

forming a drift oxide region on and in contact with the top surface, wherein the drift oxide region is located on a drift region in the operation region and in contact with the drift region;

forming a drift well region having a first conductivity type in the operation region of the semiconductor layer, wherein the drift well region is formed beneath the top surface and in contact with the top surface in the vertical direction;

forming a channel well region having a second conductivity type in the operation region, beneath the top surface and in contact with the top surface in the vertical direction, wherein the channel well region has a first impurity concentration;

forming a channel well region contact having the second conductivity type to serve as an electrical contact of the channel well region, wherein the channel well region contact is formed in the channel well region, beneath the top surface and in contact with the top surface in the vertical direction, and the channel well region contact includes a main channel well region contact and at least one sub-channel well region contact;

forming a buffer region having the second conductivity type in the operation region, wherein the buffer region is formed beneath the top surface and in contact with the top surface in the vertical direction, and the buffer region encompasses all periphery of the channel well region below the top surface of the semiconductor layer, and the buffer region is in contact with the drift well region in a channel direction which is a direction perpendicular to the vertical direction, wherein the buffer region has a second impurity concentration which is lower than the first impurity concentration;

forming a buried layer having the first conductivity type beneath the channel well region and in contact with the channel well region in the vertical direction, wherein the buried layer completely covers a portion of the channel well region which is in the operation region;

forming a gate on the top surface in the operation region, wherein the gate is substantially a rectangle that extends along a width direction which is a direction perpendicular to the vertical direction and the channel direction, and a portion of the body region and the buffer region are located right below the gate and in contact with the gate to assist forming an inverse current channel during ON operation of the high voltage device; and forming a source and a drain having the first conductivity type, wherein the source and the drain are formed in the operation region, beneath the top surface and in contact with the top surface in the vertical direction, and the source and the drain are located outside and beneath the gate, and respectively at two lateral sides of the gate, wherein the source is located in the channel well region and the drain is located in the drift well region at a location which is away from the channel well region;

wherein the drift region is located in the drift well region, between the drain and the buffer region in the channel direction, and is in contact with the top surface, to serve as a drift current channel during ON operation of the high voltage device;

wherein the main channel well region contact is adjacent to the source, and the main channel well region contact and the source substantially are rectangles that extend along the width direction, wherein the source is located between the main channel well region contact and the gate, and the sub-channel well region contact extends from the main channel well region contact toward the gate in the channel direction and contacts the inverse current channel.

17. The manufacturing method of the high voltage device of claim 16, wherein the drift oxide region includes a local oxidation of silicon (LOCOS) structure, a shallow trench isolation (STI) or a chemical vapor deposition (CVD) oxide structure.

18. The manufacturing method of the high voltage device of claim 16, wherein the channel well region contact includes a plurality of sub-channel well region contacts which are not in contact with each other.

19. The manufacturing method of the high voltage device of claim 16, wherein the source, the channel well region, the buffer region and the drift well region form a parasitic transistor, and the sub-channel well region contact provides a hot carrier absorption channel to suppress a possibility of turning ON the parasitic transistor.

20. The manufacturing method of the high voltage device of claim 16, wherein the buffer region is for reducing the capacitance between the channel well region and the drift well region during a transient state operation of the high voltage device.

* * * * *